United States Patent
Yamada et al.

(10) Patent No.: US 10,455,695 B2
(45) Date of Patent: Oct. 22, 2019

(54) STRETCHABLE CIRCUIT BOARD AND STRAIN SENSOR

(71) Applicant: Seiko Epson Corporation, Tokyo (JP)

(72) Inventors: Yohei Yamada, Chino (JP); Tomoyuki Kamakura, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/950,479

(22) Filed: Apr. 11, 2018

(65) Prior Publication Data

US 2018/0317318 A1  Nov. 1, 2018

(30) Foreign Application Priority Data

Apr. 27, 2017  (JP) .................. 2017-087983

(51) Int. Cl.
| | |
|---|---|
| *G01B 7/00* | (2006.01) |
| *H05K 1/02* | (2006.01) |
| *H05K 1/18* | (2006.01) |
| *G01B 7/16* | (2006.01) |

(Continued)

(52) U.S. Cl.
CPC ............ *H05K 1/0283* (2013.01); *G01B 7/20* (2013.01); *H05K 1/189* (2013.01); *H05K 1/111* (2013.01); *H05K 1/181* (2013.01); *H05K 3/284* (2013.01); *H05K 2201/0133* (2013.01); *H05K 2201/0191* (2013.01); *H05K 2201/09281* (2013.01); *H05K 2201/09736* (2013.01); *H05K 2201/10151* (2013.01); *H05K 2201/10439* (2013.01);

(Continued)

(58) Field of Classification Search
CPC ........ H05K 1/189; H05K 1/111; H05K 1/181; H05K 3/284; H05K 2201/0133; H05K 2201/0191; H05K 2201/09281; H05K 2201/09736; H05K 2201/10151; H05K 2201/10439; H05K 2201/2009; H05K 2203/1316
USPC ........................................... 73/774
See application file for complete search history.

(56) References Cited

U.S. PATENT DOCUMENTS

| | | | |
|---|---|---|---|
| 8,760,842 B2 * | 6/2014 | Oh .................. | H01G 4/005 174/254 |
| 2006/0225914 A1 * | 10/2006 | Tan .................. | H05K 1/028 174/254 |

(Continued)

FOREIGN PATENT DOCUMENTS

JP  2016-143763 A  8/2016

*Primary Examiner* — Max H Noori
*Assistant Examiner* — Masoud H Noori
(74) *Attorney, Agent, or Firm* — Harness, Dickey & Pierce, P.L.C.

(57) ABSTRACT

A stretchable circuit board includes a stretchable substrate, a stretchable conducting film placed on one surface of the stretchable substrate and elongated in a first direction, an electric element placed on the one surface of the stretchable substrate, and a covering portion that covers a part of the stretchable conducting film and at least a part of the electric element, wherein, when an area of a first section as a section along an outer circumference of the covering portion in the stretchable conducting film is referred to as a first area and an area of a second section as a section of the stretchable conducting film orthogonal to the first direction in a location apart from the outer circumference of the covering portion toward outside is referred to as a second area, the first area is larger than the second area.

16 Claims, 10 Drawing Sheets

(51) Int. Cl.
*H05K 1/11* (2006.01)
*H05K 3/28* (2006.01)
(52) U.S. Cl.
CPC ............... *H05K 2201/2009* (2013.01); *H05K 2203/1316* (2013.01); *H05K 2203/1322* (2013.01)

(56) References Cited

U.S. PATENT DOCUMENTS

| | | | | |
|---|---|---|---|---|
| 2009/0232925 | A1* | 9/2009 | Lin | H05K 3/0044 425/306 |
| 2014/0176832 | A1* | 6/2014 | Imazeki | G06F 3/044 349/12 |
| 2015/0101847 | A1* | 4/2015 | Tsai | H05K 3/4691 174/254 |
| 2016/0192500 | A1* | 6/2016 | Lim | H05K 1/189 361/749 |
| 2016/0345431 | A1* | 11/2016 | Lee | H05K 3/4644 |

* cited by examiner

STRETCHABLE CIRCUIT BOARD AND STRAIN SENSOR

BACKGROUND

1. Technical Field

The present invention relates to a stretchable circuit board and strain sensor.

2. Related Art

Development of stretchable electronics using stretchable sheets as stretchable substrates and placing stretchable conducting films and electric circuits on the stretchable substrates is advanced. Such a stretchable substrate is disclosed in Patent Document 1 (JP-2016-143763). According to the patent document, circuit elements and wires are connected by connecting portions. Mixture of an elastomer material and a conducting material is used for the connecting portions. When a tensile force acts on the board, the connecting portions also deform, and thereby, concentration of stress is relaxed.

In Patent Document 1, a covering portion covering terminals of electronic components is provided and a resin material is used for the covering portion. When a tensile force acts on the stretchable substrate, stress within the wires becomes larger on the outer circumference of the covering portion. The wires tend to be broken on the outer circumference of the covering portion. Accordingly, a stretchable circuit board that may suppress division of stretchable conducting films as the wires on the outer circumference of the covering portion is desired.

SUMMARY

An advantage of some aspects of the invention is to solve at least a part of the problems described above, and the invention can be implemented as the following forms or application examples.

APPLICATION EXAMPLE 1

A stretchable circuit board according to this application example includes a stretchable substrate, a stretchable conducting film placed on one surface of the stretchable substrate and elongated in a first direction, an electric element placed on the one surface of the stretchable substrate, and a covering portion that covers a part of the stretchable conducting film and at least apart of the electric element, wherein, when an area of a first section as a section along an outer circumference of the covering portion in the stretchable conducting film is referred to as a first area and an area of a second section as a section of the stretchable conducting film orthogonal to the first direction in a location apart from the outer circumference of the covering portion toward outside is referred to as a second area, the first area is larger than the second area.

According to this application example, the stretchable circuit board includes the stretchable substrate, and the stretchable conducting film elongated in the first direction is placed on one surface of the stretchable substrate. The covering portion is placed to cover a part of the stretchable conducting film and the covering portion covers at least a part of the electric element. The section of the stretchable conducting film along the outer circumference of the covering portion is referred to as the first section. Further, the area of the first section is referred to as the first area. The stretchable conducting film is also placed in the location apart from the outer circumference of the covering portion toward outside. In this location, the section of the stretchable conducting film orthogonal to the first direction of the stretchable conducting film is referred to as the second section. Further, the area of the second section is referred to as the second area. The first area of the stretchable conducting film is larger than the second area.

The covering portion has lower stretchability, and the stretchable conducting film has lower stretchability in the location in which the covering portion is placed. In the location in which the covering portion is not placed, the stretchable conducting film has higher stretchability. In the first section, the stretchability of the stretchable conducting film largely changes. Accordingly, when the stretchable conducting film is pulled, the stretchable conducting film is easily divided in the first section.

When the stretchable conducting film is pulled in the first direction, stress in the first section is smaller than stress in the second section because the first area of the stretchable conducting film is larger than the second area. Therefore, division of the stretchable conducting film in the first section located on the outer circumference of the covering portion may be suppressed.

APPLICATION EXAMPLE 2

In the stretchable circuit board according to the application example, a length of the first section as seen from a thickness direction of the stretchable substrate is longer than a length of the second section.

According to this application example, the length of the first section as seen from the thickness direction of the stretchable substrate is longer than the length of the second section. Therefore, even when the thicknesses of the stretchable conducting film are the same, the first area may be made larger than the second area.

APPLICATION EXAMPLE 3

In the stretchable circuit board according to the application example, when a direction orthogonal to the first direction in the stretchable substrate is referred to as a second direction, a length of the first section in the second direction is longer than a length of the electric element in the second direction and shorter than a length of the covering portion in the second direction.

According to this application example, the direction orthogonal to the first direction is referred to as the second direction. Further, the length of the first section is longer than the length of the electric element in the second direction as seen from the thickness direction of the stretchable substrate. Thereby, stress on the stretchable conducting film may be made smaller. Furthermore, the length of the first section in the second direction as seen from the thickness direction of the stretchable substrate is shorter than the length of the covering portion. Therefore, the length occupied by the stretchable conducting film in the second direction may be made shorter.

APPLICATION EXAMPLE 4

In the stretchable circuit board according to the application example, a thickness of the first section is thicker than a thickness of the second section.

According to this application example, the thickness of the first section is thicker than the thickness of the second section. The area of the first section may be made larger as the thickness of the first section is thicker. Therefore, even when the widths of the first section and the second section are the same, the first area may be made larger than the second area.

APPLICATION EXAMPLE 5

A stretchable circuit board according to this application example includes a stretchable conducting film placed on one surface of a stretchable substrate, and a covering portion that covers a part of the stretchable conducting film and at least a part of an electric element, wherein, when a thickness of a section of the stretchable substrate along an outer circumference of the covering portion is referred to as a first thickness and a thickness of the stretchable substrate in a location apart from the outer circumference of the covering portion is referred to as a second thickness, the first thickness is thicker than the second thickness.

According to this application example, the stretchable conducting film is placed on one surface of the stretchable substrate. The covering portion is placed on a part of the stretchable conducting film, and the covering portion covers at least a part of the electric element. The thickness of the stretchable substrate is not uniform, but different depending on the locations. The thicknesses of the section of the stretchable substrate along the outer circumference of the covering portion is the first thickness. The thickness of the stretchable substrate in the location apart from the outer circumference of the covering portion is the second thickness. The first thickness is thicker than the second thickness.

When a tensile force acts on the stretchable circuit board, displacement is smaller in the location in which the stretchable substrate is thicker than that in the location in which the substrate is thinner because stress is smaller. The displacement of the stretchable substrate is smaller because the stretchable substrate is thicker in the location along the outer circumference of the covering portion than that in the location apart from the outer circumference of the covering portion. Further, in the location in which displacement of the stretchable substrate is also smaller, the displacement of the stretchable conducting film is smaller, and thus, stress on the stretchable conducting film is smaller. Therefore, the stress in the stretchable conducting film in the location along the outer circumference of the covering portion is smaller than the stress in the location apart from the outer circumference of the covering portion. As a result, division of the stretchable conducting film on the outer circumference of the covering portion may be suppressed.

APPLICATION EXAMPLE 6

A stretchable circuit board according to this application example includes a stretchable conducting film placed on one surface of a stretchable substrate, a covering portion that covers a part of the stretchable conducting film and at least a part of an electric element, and a reinforcing portion elongated in a first direction in which the stretchable conducting film extends and making the stretchable substrate harder to expand, wherein, when a direction orthogonal to the first direction in the stretchable substrate is referred to as a second direction, the reinforcing portion is located on a side in the second direction on an outer circumference of the covering portion on a side in the first direction.

According to this application example, the stretchable conducting film is placed on one surface of the stretchable substrate. A part of the stretchable conducting film is covered by the covering portion, and the covering portion covers at least a part of the electric element. The direction in which the stretchable conducting film extends is referred to as the first direction. The direction orthogonal to the first direction in the stretchable substrate is referred to as the second direction. The reinforcing portion is placed on the side in the second direction on the outer circumference of the covering portion on the side of the first direction. The reinforcing portion has an elongated shape in the first direction.

When a tensile force acts on the stretchable substrate in the first direction, the stretchable substrate in the other parts than the part in the location in which the covering portion is placed deform and expand. On the outer circumference of the covering portion on the side in the first direction, the reinforcing portion is placed on the side in the second direction. The reinforcing portion is elongated in the first direction and makes the stretchable substrate harder to expand in the first direction Accordingly, deformation of the stretchable conducting film is suppressed on the outer circumference of the covering portion on the side in the first direction, and internal stress of the stretchable conducting film is also suppressed. As a result, division of the stretchable conducting film on the outer circumference of the covering portion may be suppressed.

APPLICATION EXAMPLE 7

In the stretchable circuit board according to the application example, a thickness of the stretchable substrate is thicker in the reinforcing portion.

According to this application example, the thickness of the stretchable substrate is thicker in the reinforcing portion. Internal stress of the stretchable substrate is smaller as the thickness of the stretchable substrate is thicker, and thus, deformation of the stretchable substrate may be suppressed. Therefore, the reinforcing portion may make the stretchable substrate harder to expand.

APPLICATION EXAMPLE 8

In the stretchable circuit board according to the application example, a reinforcing material harder to deform is placed for the stretchable substrate in the reinforcing portion.

According to this application example, the reinforcing material is placed for the stretchable substrate in the reinforcing portion. The reinforcing material is harder to deform and may suppress deformation of the stretchable substrate. Therefore, the reinforcing portion may make the stretchable substrate harder to expand.

APPLICATION EXAMPLE 9

A strain sensor according to this application example includes the above described stretchable circuit board, and a detection part provided on the stretchable circuit board and converting and outputting strain into an electric signal.

According to this application example, the strain sensor includes the stretchable circuit board. Further, the detection part that converts and outputs strain into an electric signal is provided on the stretchable circuit board. The stretchable conducting film is placed on the stretchable circuit board. Further, the above described stretchable circuit board may suppress division of the stretchable conducting film on the outer circumference of the covering portion. Therefore, the strain sensor may be formed as a sensor including the stretchable circuit board that may suppress division of the stretchable conducting film on the outer circumference of the covering portion.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
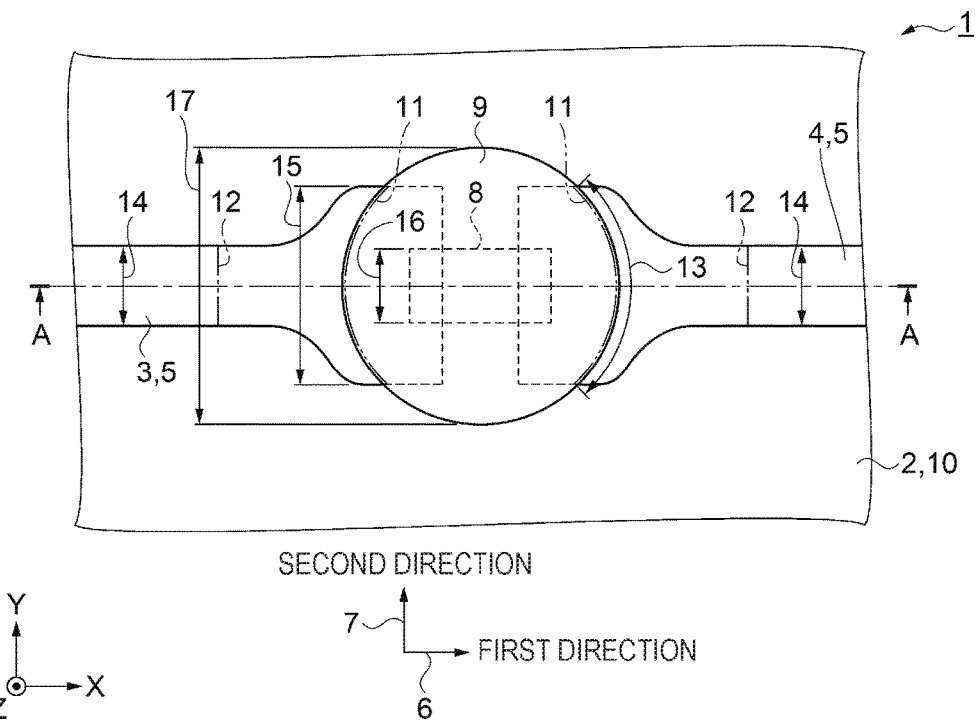
FIG. 1 is a schematic plan view showing a structure of a stretchable circuit board according to a first embodiment.
Figure 2:
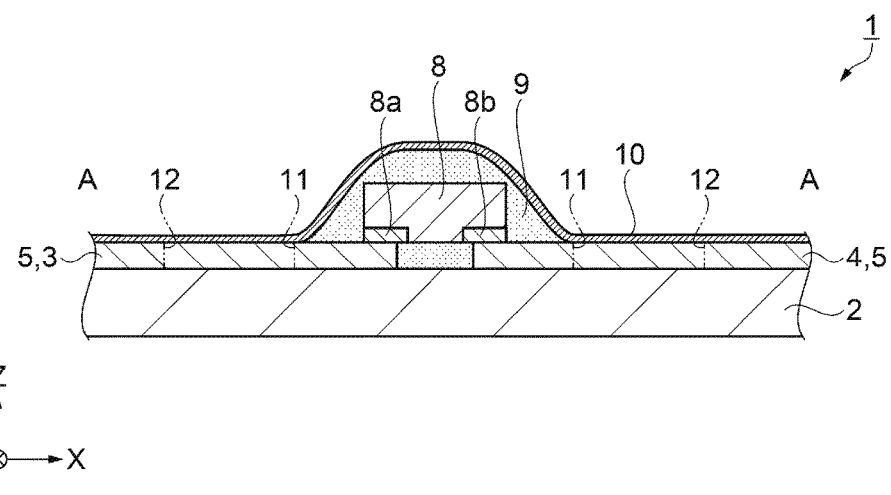
FIG. 2 is a schematic side sectional view showing the structure of the stretchable circuit board.

As below, embodiments will be explained according to the drawings. Note that the respective members in the respective drawings are differently scaled in sizes recognizable in the respective drawings.
First Embodiment In the embodiment, a characteristic example of a stretchable circuit board in which stretchable conducting films are provided as wires will be explained according to the drawings. A stretchable circuit board according to the first embodiment will be explained according to FIGS. 1 to 3. FIG. 1 is a schematic plan view showing a structure of the stretchable circuit board. FIG. 2 is a schematic side sectional view showing the structure of the stretchable circuit board. FIG. 2 is the view as seen from the side of the section along line AA in FIG. 1.

As shown in FIGS. 1 and 2, a stretchable circuit board includes a stretchable substrate 2. The stretchable substrate 2 is not particularly limited as long as the substrate has insulation properties and stretchability. For example, the stretchable substrate 2 may be a substrate of a stretchable resin formed in a sheet shape or a substrate provided with stretchability by a fibrous resin.

A first wire 3 and a second wire 4 are provided on the stretchable substrate 2. The first wire 3 and the second wire 4 are stretchable conducting films 5. The stretchable conducting films 5 are formed using a material having stretchability and conductivity. For example, the stretchable conducting films 5 may be provided by printing and solidification of paste as mixture of conducting particles with an elastomer on the stretchable substrate 2. For the conducting particles, metal particles of silver, copper, nickel, or the like or carbon particles may be used. For the elastomer, a thermosetting resin elastomer such as urethan rubber, silicone rubber, or fluorocarbon rubber may be used. In addition, a thermoplastic elastomer may be employed.

The stretchable conducting films 5 of the first wire 3 and the second wire 4 are provided on one surface of the stretchable substrate 2 and placed to be elongated in one line. The stretchable conducting films 5 may be provided directly on the stretchable substrate 2. Or, a film such as an insulating film may be provided on the stretchable substrate 2 and the stretchable conducting films 5 may be provided on the film.

The direction in which the first wire 3 and the second wire 4 are elongated is referred to as a first direction 6. In the stretchable substrate 2, a direction orthogonal to the first direction 6 is referred to as a second direction 7. The length of the first wire 3 in the second direction 7 corresponds to the width of the first wire 3, and the length of the second wire 4 in the second direction 7 corresponds to the width of the second wire 4. In the drawings, the first direction 6 is referred to as "X-direction" and the second direction 7 is referred to as "Y-direction". The thickness direction of the stretchable substrate 2 is referred to as "Z-direction". The length of the first wire 3 in the Z-direction corresponds to the thickness of the first wire 3 and the length of the second wire 4 in Z-direction corresponds to the thickness of the second wire 4. The X-direction, Y-direction, Z-direction are orthogonal to one another.

The first wire 3 and the second wire 4 are placed apart in the first direction 6. On the first wire 3 and the second wire 4 as the stretchable conducting films 5, an electric element 8 is placed over the first wire 3 and the second wire 4. Therefore, the electric element 8 is placed on the one surface of the stretchable substrate 2. The type of the electric element 8 is not particularly limited, but the electric element 8 corresponds to a chip resistance, chip capacitor, or chip-type transistor integrated circuit. The size of the electric element 8 is not particularly limited, however, in the embodiment, for example, the length of the electric element 8 in the first direction 6 is 1 mm and the length in the second direction 7 is 0.5 mm. The thickness of the electric element 8 is 350 μm.

In the embodiment, the electric element 8 includes a first terminal 8a and a second terminal 8b. The first terminal 8a is connected to the first wire 3 and the second terminal 8b is connected to the second wire 4. The current flowing in the first wire 3 flows through the electric element 8 to the second wire 4.

On the electric element 8, a covering portion 9 that covers at least a part of the electric element 8 is placed. The covering portion 9 may cover a part of the electric element 8 or all of the electric element 8. Further, the covering portion 9 is placed to cover parts of the stretchable conducting films 5. The covering portion 9 suppresses changes in electrical characteristics due to adhesion of water and dust to the electric element 8. Furthermore, the covering portion 9 also has a function of fixing the electric element 8 to the stretchable substrate 2. The material of the covering portion 9 is preferably a resin material having flexibility, and epoxy resin or various resins such as silicone resin, rubbers, or the like may be used. The covering portion 9 is also called a potting material.

A wire protective portion 10 is placed to cover the stretchable substrate 2, the stretchable conducting films 5, and the covering portion 9. The wire protective portion 10 is a resin film having stretchability. The film thickness is 150 µm and the portion functions as an insulating coating for the first wire 3 and the second wire 4. Therefore, electric leakage of the first wire 3 and the second wire 4 is suppressed and adhesion of water and dust thereto is suppressed.

Of the members forming the stretchable circuit board 1, the stretchable substrate 2, the first wire 3, and the second wire 4 have the highest stretchability. The stretchability of the wire protective portion 10 is next highest, and the covering portion 9 has the lower stretchability than the wire protective portion 10. The electric element 8 has the lower stretchability than the covering portion 9. In comparison in Young's modulus of the respective parts, the Young's modulus of the stretchable substrate 2, the first wire 3, and the second wire 4 is 2.4 MPa and the Young's modulus of the covering portion 9 is 50 MPa. The Young's modulus of the wire protective portion changes depending on the thickness. The approximate Young's modulus of the wire protective portion 10 is nearly equal to the stretchable substrate 2.

The sections along the outer circumference of the covering portion 9 in the stretchable conducting films 5 are referred to as first sections 11. The sections of the stretchable conducting films 5 extending in the second direction 7 orthogonal to the first direction 6 in the locations apart from the outer circumference of the covering portion 9 toward outside are referred to as second sections 12. In the drawings, the first sections 11 and the second sections 12 are the surfaces shown by two-dashed dotted lines. Note that the stretchable conducting films 5 include the first wire 3 and the second wire 4. The first section 11 in the first wire 3 and the first section 11 in the second wire 4 have the same shape. Further, the second section 12 in the first wire 3 and the second section 12 in the second wire 4 have the same shape.

Figure 3:
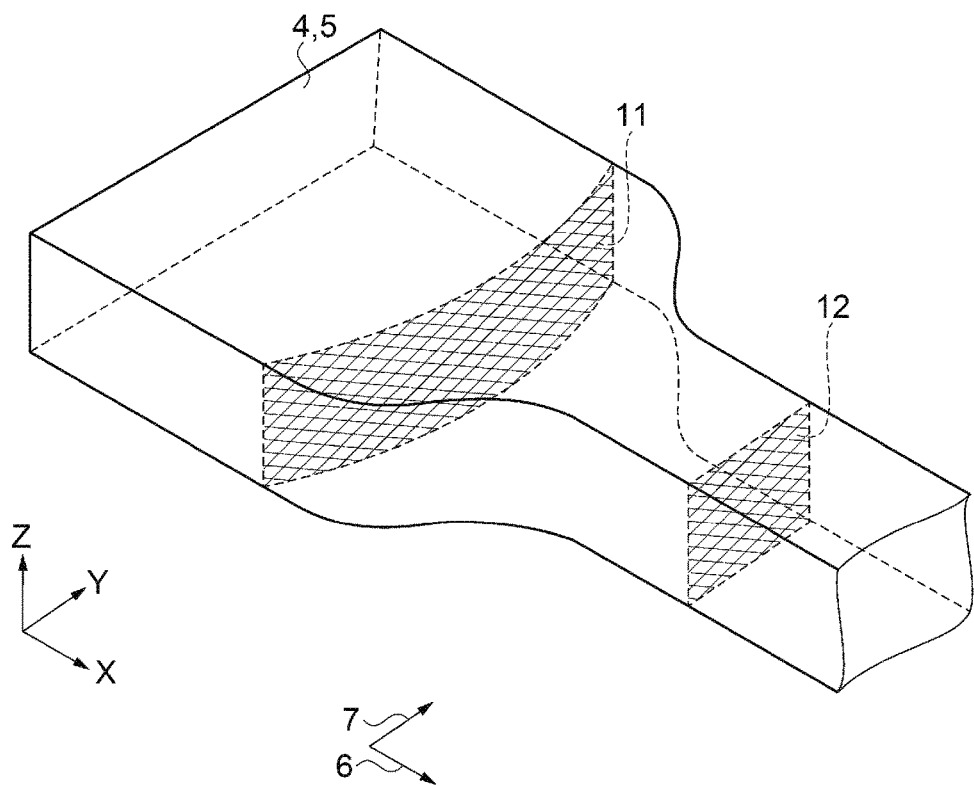
FIG. 3 is a schematic perspective view of a main part for explanation of a first section and a second section.

FIG. 3 is a schematic perspective view of a main part for explanation of the first section and the second section. As shown in FIG. 3, the shape of the stretchable conducting film 5 has a part with a longer length and a part with a shorter length in the second direction 7. The first section 11 is located in the part in which the length in the second direction 7 is longer and the second section 12 is located in the part in which the length in the second direction 7 is shorter. The area of the first section 11 is referred to as a first area and the area of the second section 12 is referred to as a second area. In this regard, the first area is larger than the second area.

The covering portion 9 has lower stretchability than the stretchable substrate 2 and the stretchable conducting films 5. In the location in which the covering portion 9 is placed, the stretchable conducting films 5 are fixed by the covering portion 9. Accordingly, in the location in which the covering portion 9 is placed, the stretchability of the stretchable conducting films 5 is lower. In the location in which the covering portion 9 is not placed, the stretchability of the stretchable conducting films 5 is higher. The stretchable conducting film 5 in the second wire 4 has the lower stretchability on the side in the −X-direction of the first section 11 and the higher stretchability on the side in the +X-direction of the first section 11. As described above, in the first section 11, the stretchability of the stretchable conducting film 5 largely changes. Accordingly, when the stretchable conducting film 5 is pulled, the stretchable conducting film 5 is easily divided in the first section 11.

When the stretchable conducting film 5 is pulled in the first direction 6, the stress in the first section 11 is smaller than the stress in the second section 12 because the first area of the stretchable conducting film 5 is larger than the second area. Therefore, division of the stretchable conducting film 5 in the first section 11 located on the outer circumference of the covering portion 9 may be suppressed.

Returning to FIGS. 1 and 2, the lengths of the first sections 11 as seen from the thickness direction of the stretchable substrate 2 are referred to as first lengths 13. The first lengths 13 are lengths of the surfaces along the outer circumference of the covering portion 9. Further, the lengths of the second sections 12 as seen from the thickness direction of the stretchable substrate 2 are referred to as second lengths 14. The second lengths 14 are the lengths of the stretchable conducting films 5 in the second direction 7. In this regard, the first lengths 13 are longer than the second lengths 14. Therefore, even when the thicknesses of the stretchable conducting films 5 are the same, the first areas may be made larger than the second areas.

The lengths of the first sections 11 in the second direction 7 are referred to as third lengths 15. The length of the electric element 8 in the second direction 7 is referred to as a fourth length 16. The third lengths 15 are longer than the fourth length 16. The stress on the stretchable conducting films 5 may be made smaller in the case where the third lengths 15 are longer than the fourth length 16 than that in the case where the third lengths 15 are equal to the fourth length 16.

The length of the covering portion 9 in the second direction 7 is referred to as a fifth length 17. The third lengths 15 are shorter than the fifth length 17. Therefore, the length occupied by the stretchable conducting films 5 in the second direction 7 may be made shorter than the fifth length 17. Accordingly, for arrangement of a plurality of the stretchable conducting films 5 in the second direction 7, lots of stretchable conducting films 5 may be arranged.

The widths of the stretchable conducting films 5 in the second direction 7 gently change between the first sections 11 and the second sections 12. According to the shapes, even when bending stress acts on the stretchable conducting films 5, stress concentration may be suppressed.

Next, a manufacturing method of the stretchable circuit board 1 is explained. First, the material of the stretchable conducting films 5 is printed on the stretchable substrate 2. The material of the stretchable conducting films 5 is in the paste form and may be printed using the screen printing method or offset printing method. The planar shapes of the stretchable conducting films 5 are formed in the shapes of the first wire 3 and the second wire 4. Then, the electric element 8 is placed over the first wire 3 and the second wire 4. The first wire 3 and the second wire 4 are in the paste forms and the electric element 8 is hard to move when the electric element 8 is placed.

Then, the stretchable conducting films 5 are solidified by heating and drying. The stretchable conducting films 5 are cured by further heating. The heating condition is not particularly limited, but, in the embodiment, for example, the films are heated at 80 degrees C. for about 30 minutes. Thereby, the electric element 8 is fixed to the first wire 3 and the second wire 4. Then, the material of the covering portion 9 is applied to cover the electric element 8. The method of applying the material of the covering portion 9 is not particularly limited, but, in the embodiment, for example, a fixed quantity is applied using a syringe. Then, the material of the covering portion 9 is solidified by heating. Subsequently, the material of the wire protective portion 10 is applied. The method of applying the material of the wire protective portion 10 is not particularly limited, but, in the embodiment, for example, the screen printing method is used for application. The material of the wire protective portion 10 contains a photocuring additive. Then, the material of the wire protective portion 10 is cured by irradiation with an ultraviolet ray. The stretchable circuit board 1 is completed in the above described process.

As described above, the embodiment has the following advantages.

(1) According to the embodiment, the stretchable conducting films 5 elongated in the first direction 6 are placed on one surface of the stretchable substrate 2. The covering portion 9 is placed on the parts of the stretchable conducting films 5 and the covering portion 9 covers at least a part of the electric element 8. The sections of the stretchable conducting films 5 along the outer circumference of the covering portion 9 are referred to as the first sections 11. The areas of the first sections 11 are referred to as the first areas. The stretchable conducting films 5 are also placed in the locations apart from the outer circumference of the covering portion 9 toward outside. In the locations, the sections of the stretchable conducting films orthogonal to the first direction 6 of the stretchable conducting films 5 are the second sections 12. The areas of the second sections 12 are referred to as the second areas. The first areas of the stretchable conducting films 5 are larger than the second areas.

The covering portion 9 has lower stretchability, and thus, in the location in which the covering portion 9 is placed, the stretchable conducting films 5 have the lower stretchability. In the location in which the covering portion 9 is not placed, the stretchable conducting films 5 have the higher stretchability. In the first sections 11, the stretchability of the stretchable conducting films 5 largely changes. Accordingly, when the stretchable conducting films 5 are pulled, the stretchable conducting films 5 are easily divided in the first sections 11.

When the stretchable conducting films 5 are pulled in the first direction 6, the stress in the first sections 11 is smaller than the stress in the second sections 12 because the first areas of the stretchable conducting films 5 are larger than the second areas. Therefore, division of the stretchable conducting films 5 in the first sections 11 located on the outer circumference of the covering portion 9 may be suppressed.

(2) According to the embodiment, the lengths of the first sections 11 as seen from the thickness direction of the stretchable substrate 2 are longer than the lengths of the second sections 12. Therefore, even when the thicknesses of the stretchable conducting films 5 are the same, the first areas may be made larger than the second areas.

(3) According to the embodiment, the third lengths 15 showing the lengths of the first sections 11 in the second direction 7 as seen from the thickness direction of the stretchable substrate 2 are longer than the fourth length 16 showing the length of the electric element 8. Thereby, the stress on the stretchable conducting films 5 may be made smaller. Further, the third lengths 15 showing the lengths of the first sections 11 as seen from the thickness direction of the stretchable substrate 2 are shorter than the fifth length 17 showing the length of the covering portion 9. Therefore, the length occupied by the stretchable conducting films 5 in the second direction 7 may be made shorter.

Second Embodiment

Next, one embodiment of the stretchable circuit board will be explained using FIGS. 4 to 8. The embodiment is different from the first embodiment in that the planar shapes and the shapes in the thickness direction of the stretchable conducting films 5 shown in FIG. 2 are different. The explanation of the same points as those of the first embodiment will be omitted.

Figure 4:
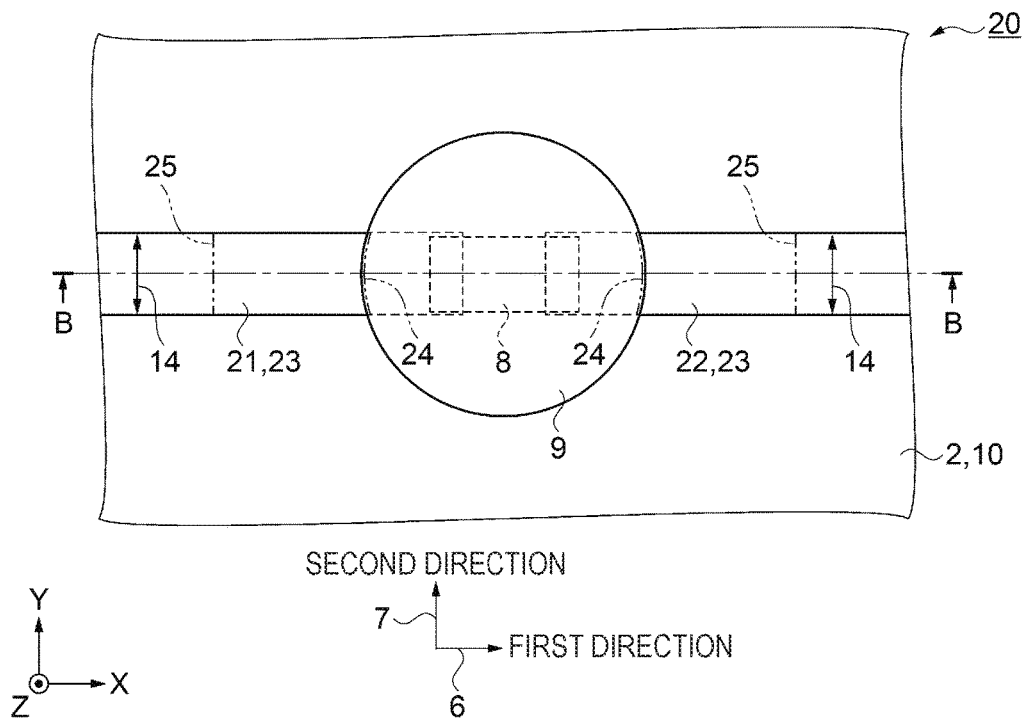
FIG. 4 is a schematic plan view showing a structure of a stretchable circuit board according to a second embodiment.
Figure 5:
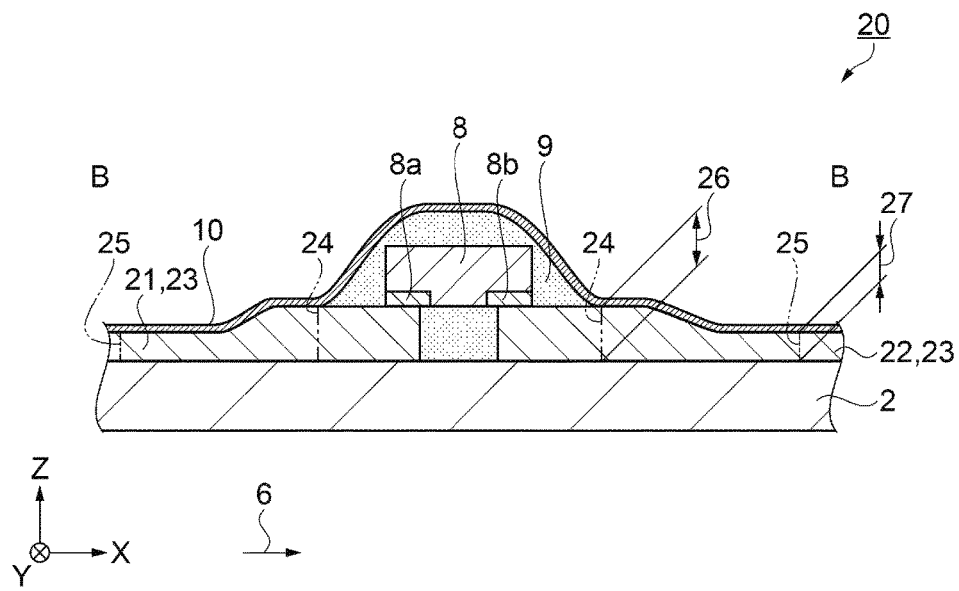
FIG. 5 is a schematic side sectional view showing the structure of the stretchable circuit board.

FIG. 4 is a schematic plan view showing a structure of the stretchable circuit board. FIG. 5 is a schematic side sectional view showing the structure of the stretchable circuit board. FIG. 5 is the view as seen from the side of the section along line BB in FIG. 4. That is, in the embodiment, a stretchable circuit board 20 includes the stretchable substrate 2 as shown in FIGS. 4 and 5. A first wire 21 and a second wire 21 are provided on one surface of the stretchable substrate 2. The first wire 21 and the second wire 22 are stretchable conducting films 23.

The first wire 21 and the second wire 22 are placed apart in the first direction 6. On the first wire 21 and the second wire 22 as the stretchable conducting films 23, the electric element 8 is placed over the first wire 21 and the second wire 22. The first terminal 8a of the electric element 8 is connected to the first wire 21 and the second terminal 8b is connected to the second wire 22.

On the electric element 8, the covering portion 9 that covers the electric element 8 is placed. The covering portion 9 is also placed in parts on the stretchable conducting films 23. The wire protective portion 10 is placed to cover the stretchable substrate 2, the stretchable conducting films 23, and the covering portion 9.

The stretchable conducting films 23 have fixed lengths of second lengths 14 in the second direction 7. The sections along the outer circumference of the covering portion 9 in the stretchable conducting films 23 are referred to as first sections 24. The sections of the stretchable conducting films 23 extending in the second direction 7 orthogonal to the first direction 6 in the locations apart from the outer circumference of the covering portion 9 toward outside are referred to as second sections 25. In the drawings, the first sections 24 and the second sections 25 are the surfaces shown by two-dashed dotted lines. Note that the stretchable conducting films 23 include the first wire 21 and the second wire 22. The first section 24 in the first wire 21 and the first section 24 in the second wire 22 have the same shape. Further, the second section 25 in the first wire 21 and the second section 25 in the second wire 22 have the same shape.

First thicknesses 26 as the thicknesses of the first sections 24 are thicker than second thicknesses 27 as the thicknesses of the second sections 25. The areas of the first sections 24 may be made larger as the thicknesses of the first sections 24 are thicker. Therefore, even when the second lengths 14 as the widths of the first sections 24 and the second sections 25 are the same, the first areas as the areas of the first sections 24 may be made larger than the second areas as the areas of the second sections 25. As a result, when the stretchable conducting films 23 are pulled in the first direction 6, the internal stress on the first sections 24 may be made smaller than the internal stress on the second sections 25. Therefore, division of the stretchable conducting films 23 in the first sections 24 located on the outer circumference of the covering portion 9 may be suppressed.

The thicknesses of the stretchable conducting films 23 gently change between the first sections 24 and the second sections 25. According to the shapes, even when bending stress acts on the stretchable conducting films 23, stress concentration may be suppressed.

Figure 6:
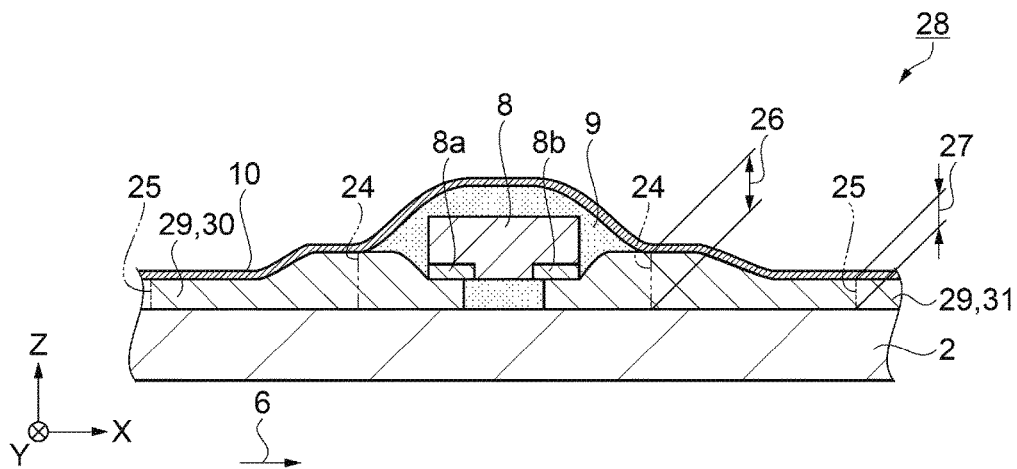
FIG. 6 is a schematic side sectional view showing the structure of the stretchable circuit board.

FIG. 6 is a schematic side sectional view showing the structure of the stretchable circuit board. On a stretchable circuit board 28 shown in FIG. 6, stretchable conducting films 29 are placed in place of the stretchable conducting films 23 of the stretchable circuit board 20. The stretchable conducting films 29 include a first wire 30 on the side in the −X-direction and a second wire 31 on the side in the +X-direction. The sections along the outer circumference of the covering portion 9 in the stretchable conducting films 29 are referred to as first sections 24. The sections of the stretchable conducting films 29 extending in the second direction 7 orthogonal to the first direction 6 in the locations apart from the outer circumference of the covering portion 9 toward outside are referred to as second sections 25. In the stretchable conducting films 29, the thicknesses of the first sections 24 are first thicknesses 26 and the thicknesses of the second sections 25 are second thicknesses 27. The thicknesses in the locations facing the electric element 8 are thinner than the first thicknesses 26.

Also, in this case, the first areas as the areas of the first sections 24 may be made larger than the second areas as the areas of the second sections 25. As a result, when the stretchable conducting films 29 are pulled in the first direction 6, the internal stress on the first sections 24 may be made smaller than the internal stress on the second sections 25. Therefore, division of the stretchable conducting films 29 in the first sections 24 located on the outer circumference of the covering portion 9 may be suppressed.

Figure 7:
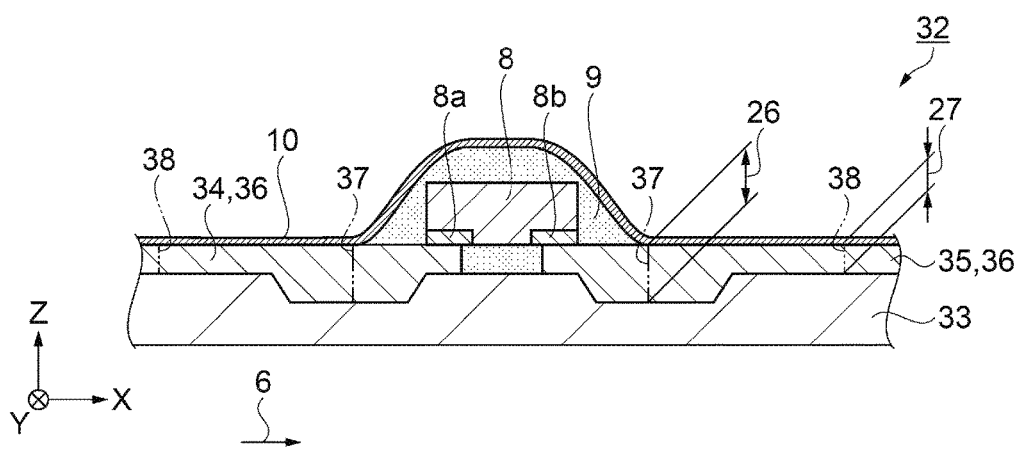
FIG. 7 is a schematic side sectional view showing the structure of the stretchable circuit board.

FIG. 7 is a schematic side sectional view showing the structure of the stretchable circuit board. A stretchable circuit board 32 shown in FIG. 7 includes a stretchable substrate 33. On the stretchable substrate 33, a first wire 34 and a second wire 35 are placed. The first wire 34 and the second wire 35 are stretchable conducting films 36. The first wire 34 and the second wire 35 are placed apart in the first direction 6. On the first wire 34 and the second wire 35 as the stretchable conducting films 36, the electric element 8 is placed over the first wire 34 and the second wire 35. The first terminal 8a of the electric element 8 is connected to the first wire 34 and the second terminal 8b is connected to the second wire 35.

On the electric element 8, the covering portion 9 that covers at least apart of the electric element 8 is placed. The covering portion 9 is also placed in parts on the stretchable conducting films 36. The wire protective portion is placed to cover the stretchable substrate 33, the stretchable conducting films 36, and the covering portion 9. The sections along the outer circumference of the covering portion 9 in the stretchable conducting films 36 are referred to as first sections 37. The sections of the stretchable conducting films 36 extending in the second direction 7 orthogonal to the first direction 6 in the locations apart from the outer circumference of the covering portion 9 toward outside are referred to as second sections 38.

In the stretchable substrate 33, the thicknesses of the locations in the first sections 37 are thinner than the thicknesses of the locations in the second sections 38. Further, in the stretchable conducting films 36, the first thicknesses 26 showing the thicknesses in the first sections 37 are thicker than the second thicknesses 27 showing the thicknesses in the second sections 38. Thereby, the stretchable conducting films 36 have flat surfaces on the side in the +z-direction. As a result, the electric element 8 may be easily placed on the stretchable conducting films 36.

Also, in this case, the first areas as the areas of the first sections 37 may be made larger than the second areas as the areas of the second sections 38. As a result, when the stretchable conducting films 36 are pulled in the first direction 6, the internal stress on the first sections 37 may be made smaller than the internal stress on the second sections 38. Therefore, division of the stretchable conducting films 36 in the first sections 37 located on the outer circumference of the covering portion 9 may be suppressed.

Figure 8:
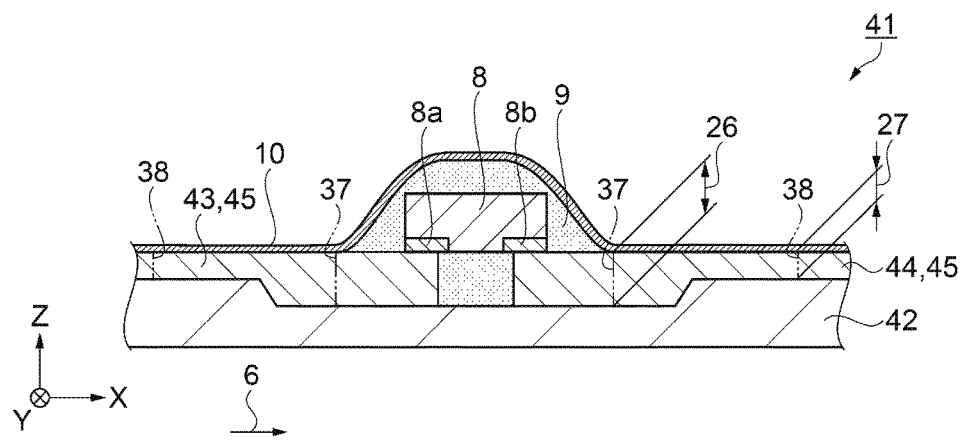
FIG. 8 is a schematic side sectional view showing the structure of the stretchable circuit board.

FIG. 8 is a schematic side sectional view showing the structure of the stretchable circuit board. A stretchable circuit board 41 shown in FIG. 8 includes a stretchable substrate 42. On the stretchable substrate 42, a first wire 43 and a second wire 44 are placed. The first wire 43 and the second wire 44 are stretchable conducting films 45. The first wire 43 and the second wire 44 are placed apart in the first direction 6. The structures of the electric element 8, the covering portion 9, and the wire protective portion 10 placed on the stretchable conducting films 45 are the same as those in the stretchable circuit board 32, and their explanation will be omitted.

In the stretchable substrate 42, the thicknesses in the locations facing the electric element 8 are the same as the thicknesses in the locations facing the first sections 37. Further, in the stretchable conducting films 45, the thicknesses in the locations facing the electric element 8 are the same as the thicknesses in the first sections 37. In the stretchable conducting films 45, the first thicknesses 26 showing the thicknesses in the first sections 37 are thicker than the second thicknesses 27 showing the thicknesses in the second sections 38.

Also, in this case, the first areas as the areas of the first sections 37 may be made larger than the second areas as the areas of the second sections 38. As a result, when the stretchable conducting films 45 are pulled in the first direction 6, the internal stress on the first sections 37 may be made smaller than the internal stress on the second sections 38. Therefore, division of the stretchable conducting films 45 in the first sections 37 located on the outer circumference of the covering portion 9 may be suppressed.

As described above, the embodiment has the following advantages.

(1) According to the embodiment, the first thicknesses 26 showing the thicknesses of the first sections 24 in the stretchable circuit board 20 and the stretchable conducting films 28 are thicker than the second thicknesses 27 showing the thicknesses of the second sections 25. The areas of the first sections 24 may be made larger because the thicknesses of the first sections 24 are thicker. Similarly, the first thicknesses 26 showing the thicknesses of the first sections 37 in the stretchable circuit board 32 and the stretchable conducting films 41 are thicker than the second thicknesses 27 showing the thicknesses of the second sections 38. The areas of the first sections 37 may be made larger because the thicknesses of the first sections 37 are thicker. Therefore, even when the widths of the first sections 24 and the second sections 25 are the same, the first areas may be made larger than the second areas.

Third Embodiment

Next, one embodiment of the stretchable circuit board will be explained using FIGS. 9 to 11. The embodiment is different from the second embodiment in that the thicknesses of the stretchable conducting films 23 shown in FIG. 5 are fixed and the shape of the stretchable substrate 2 in the thickness direction is different. The explanation of the same points as those of the second embodiment will be omitted.

Figure 9:
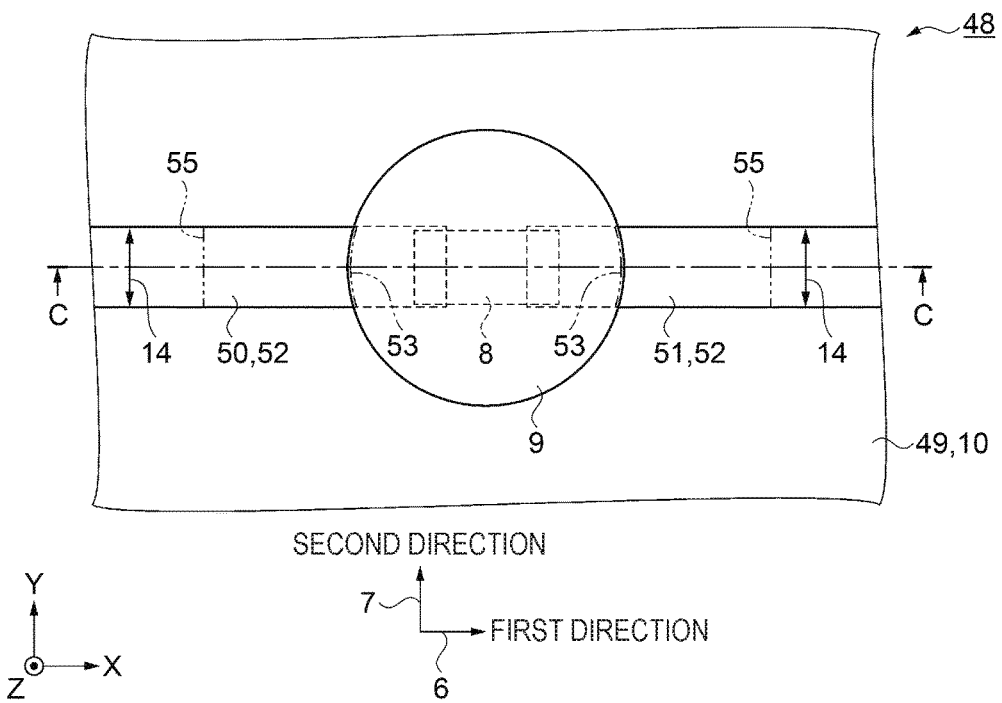
FIG. 9 is a schematic plan view showing a structure of a stretchable circuit board according to a third embodiment.
Figure 10:
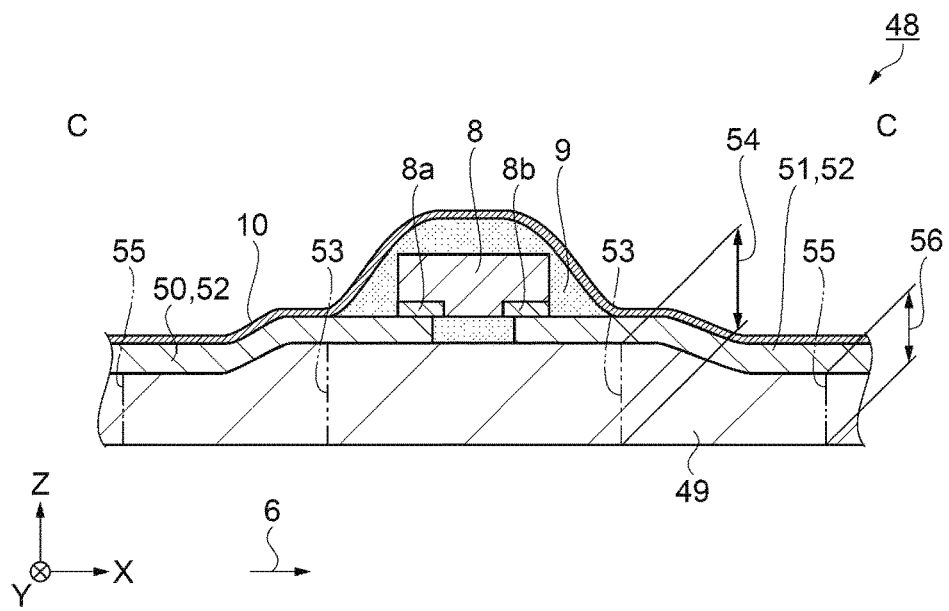
FIG. 10 is a schematic side sectional view showing the structure of the stretchable circuit board.

FIG. 9 is a schematic plan view showing the structure of the stretchable circuit board. FIG. 10 is a schematic side sectional view showing the structure of the stretchable circuit board. FIG. 10 shows the view as seen from the side of the section along the line CC in FIG. 9. That is, in the embodiment, a stretchable circuit board 48 includes a stretchable substrate 49 as shown in FIGS. 9 and 10. A first wire 50 and a second wire 51 are provided on one surface of the stretchable substrate 49. The first wire 50 and the second wire 51 are stretchable conducting films 52.

The first wire 50 and the second wire 51 are placed apart in the first direction 6. On the first wire 50 and the second wire 51 as the stretchable conducting films 52, the electric element 8 is placed over the first wire 50 and the second wire 51. The first terminal 8a of the electric element 8 is connected to the first wire 50 and the second terminal 8b is connected to the second wire 51.

On the electric element 8, the covering portion 9 that covers at least apart of the electric element 8 is placed. The covering portion 9 may cover all or a part of the electric element 8. Further, the covering portion 9 is placed to cover parts of the stretchable conducting films 52. The wire protective portion 10 is placed to cover the stretchable substrate 49, the stretchable conducting films 52, and the covering portion 9.

The stretchable conducting films 52 have fixed lengths of the second lengths 14 in the second direction 7. Further, the stretchable conducting films 52 have fixed thicknesses. Therefore, the areas of the sections of the stretchable conducting films 52 in the second direction 7 are fixed regardless of the locations.

The thickness of the stretchable substrate 49 is different depending on the locations. The thicknesses of third sections 53 as the sections of the stretchable substrate 49 along the outer circumference of the covering portion 9 are referred to as first thicknesses 54. The thicknesses of fourth sections 55 as the sections of the stretchable substrate 49 in the locations apart from the outer circumference of the covering portion 9 are referred to as second thicknesses 56. In the drawings, the third sections 53 and the fourth sections 55 are the surfaces shown by two-dashed dotted lines. In this regard, the first thicknesses 54 are thicker than the second thicknesses 56. Note that the stretchable conducting films 52 include the first wire 50 and the second wire 51. The third section 53 in the location facing the first wire 50 and the third section 53 in the location facing the second wire 51 have the same shape and have the same first thickness 54. Further, the fourth section 55 in the location facing the first wire 50 and the fourth section 55 in the location facing the second wire 51 have the same shape and have the same second thickness 56.

When a tensile force in the first direction 6 acts on the stretchable circuit board 48, displacement is smaller in the location in which the stretchable substrate 49 is thicker than that in the location in which the board is thinner because stress is smaller. The displacement of the stretchable substrate 49 is smaller because the stretchable substrate 49 is thicker in the third sections 53 in the locations along the outer circumference of the covering portion 9 than that in the fourth sections 55 in the locations apart from the outer circumference of the covering portion 9. Further, in the locations in which the displacement of the stretchable substrate 49 is smaller, the displacements of the stretchable conducting films 52 are smaller, and thus, stress on the stretchable conducting films 52 is smaller. Therefore, the stress in the stretchable conducting films 52 in the locations along the outer circumference of the covering portion 9 is smaller than the stress in the locations apart from the outer circumference of the covering portion 9. As a result, division of the stretchable conducting films 52 near the third sections 53 located on the outer circumference of the covering portion 9 may be suppressed.

The thickness of the stretchable substrate 49 gently changes between the third sections 53 and the fourth sections 55. According to the shapes, even when bending stress acts on the stretchable circuit board 48, stress concentration may be suppressed.

Figure 11:
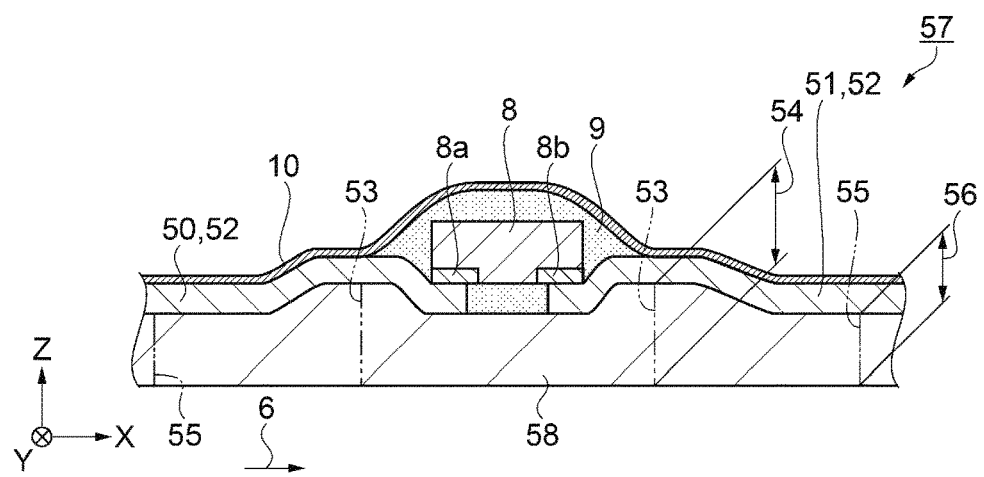
FIG. 11 is a schematic side sectional view showing the structure of the stretchable circuit board.

FIG. 11 is a schematic side sectional view showing the structure of the stretchable circuit board. In a stretchable circuit board 57 shown in FIG. 11, a stretchable substrate 58 is placed in place of the stretchable substrate 49 of the stretchable circuit board 48. In the locations facing the electric element 8, the thickness of the stretchable substrate 58 is thinner than the first thickness 54.

Also, in this case, the first thicknesses 54 as the thicknesses of the third sections 53 are thicker than the second thicknesses 56 as the thicknesses of the fourth sections 55. As a result, the displacements in the third sections 53 when the stretchable circuit board 57 is pulled in the first direction 6 may be made smaller than the displacements in the fourth sections 55. Therefore, division of the stretchable conducting films 52 on the outer circumference of the covering portion 9 may be suppressed.

As described above, the embodiment has the following advantages.

(1) According to the stretchable circuit board 48 of the embodiment, the stretchable conducting films 52 are placed on one surface of the stretchable substrate 49. The covering portion 9 is placed to cover parts of the stretchable conducting films 52 and the covering portion 9 covers at least a part of the electric element 8. The thickness of the stretchable substrate 49 is not uniform, but different depending on the locations. The thicknesses of the sections of the stretchable substrate 49 along the outer circumference of the covering portion 9 are the first thicknesses 54. The thicknesses of the stretchable substrate 49 in the locations apart from the outer circumference of the covering portion 9 are the second thicknesses 56. The first thicknesses 54 are thicker than the second thicknesses 56.

When a tensile force acts on the stretchable circuit board 48, displacement is smaller in the location in which the stretchable substrate 49 is thicker than that in the location in which the substrate is thinner because stress is smaller. The displacement of the stretchable substrate 49 is smaller because the stretchable substrate 49 is thicker in the locations along the outer circumference of the covering portion 9 than that in the locations apart from the outer circumference of the covering portion 9. Further, in the locations in which the displacement of the stretchable substrate 49 is smaller, the displacement of the stretchable conducting films 52 is smaller, and thus, stress on the stretchable conducting films 52 is smaller. Therefore, the stress in the stretchable conducting films 52 in the locations along the outer circumference of the covering portion 9 is smaller than the stress in the locations apart from the outer circumference of the covering portion 9. As a result, division of the stretchable conducting films 52 on the outer circumference of the covering portion 9 may be suppressed.

(2) Also, in the stretchable circuit board 57 of the embodiment, the first thicknesses 54 as the thicknesses of the third sections 53 are thicker than the second thicknesses 56 as the thicknesses of the fourth sections 55. As a result, when the stretchable circuit board 57 is pulled in the first direction 6, the displacements in the third sections 53 in the stretchable substrate 58 may be made smaller than the displacements in the fourth sections 55. Therefore, division of the stretchable conducting films 52 near the outer circumference of the covering portion 9 may be suppressed.

Fourth Embodiment

Next, one embodiment of the stretchable circuit board will be explained using FIGS. 12 to 15. The embodiment is different from the third embodiment in that the thickness of the stretchable substrate 49 shown in FIG. 10 is fixed and reinforcing portions extending in the first direction 6 alongside with the stretchable conducting films 52 are placed. The explanation of the same points as those of the third embodiment will be omitted.

Figure 12:
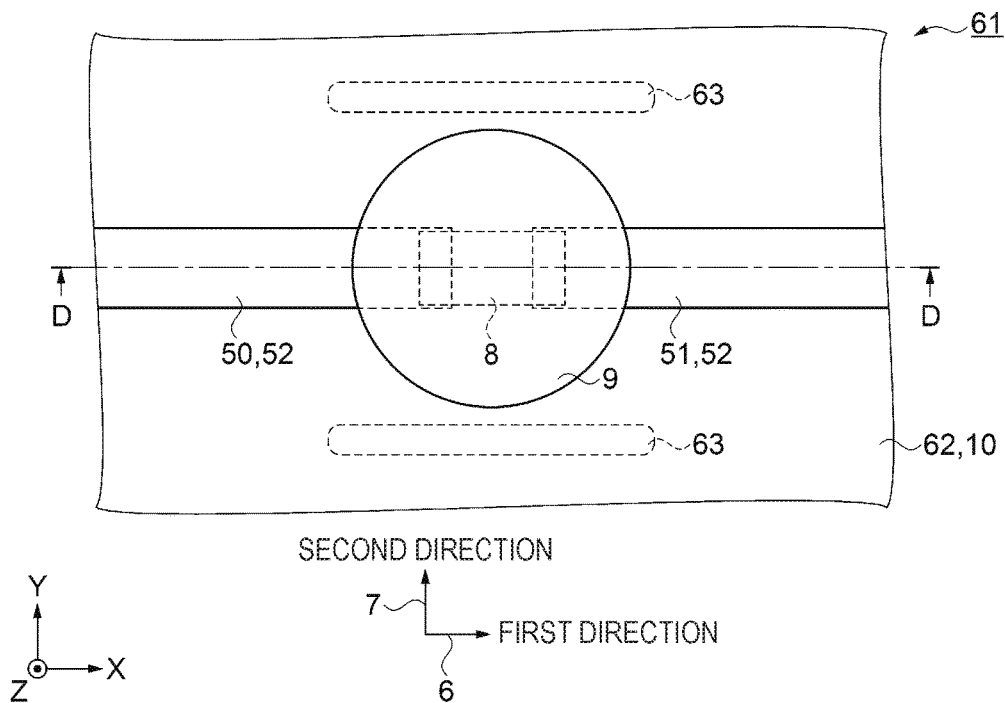
FIG. 12 is a schematic plan view showing a structure of a stretchable circuit board according to a fourth embodiment.
Figure 13:
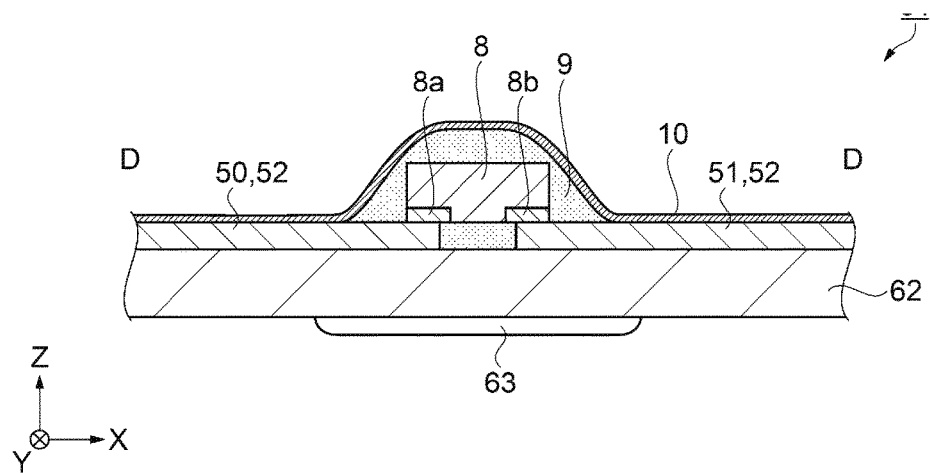
FIG. 13 is a schematic side sectional view showing the structure of the stretchable circuit board.

FIG. 12 is a schematic plan view showing a structure of a stretchable circuit board. FIG. 13 is a schematic side sectional view showing the structure of the stretchable circuit board. FIG. 13 shows the view as seen from the side of the section along the line DD in FIG. 12. That is, in the embodiment, a stretchable circuit board 61 includes a stretchable substrate 62 as shown in FIGS. 12 and 13. The first wire 50 and the second wire 51 are placed on one surface of the stretchable substrate 62. The first wire 50 and the second wire 51 are the stretchable conducting films 52.

The first wire 50 and the second wire 51 are placed apart in the first direction 6. On the first wire 50 and the second wire 51 as the stretchable conducting films 52, the electric element 8 is placed over the first wire 50 and the second wire 51. The first terminal 8a of the electric element 8 is connected to the first wire 50 and the second terminal 8b is connected to the second wire 51.

On the electric element 8, the covering portion 9 that covers at least apart of the electric element 8 is placed. Further, the covering portion 9 is placed to cover parts of the stretchable conducting films 52. The wire protective portion 10 is placed to cover the stretchable substrate 62, the stretchable conducting films 52, and the covering portion 9.

Reinforcing portions 63 are placed on the side in the +Y-direction and the side in the −Y-direction of the covering portion 9. In the reinforcing portions 63, reinforcing materials harder to deform are placed for the stretchable substrate 62. The reinforcing portions 63 are elongated in the first direction 6 in which the stretchable conducting films 52 extend to make the stretchable substrate 62 harder to expand. The reinforcing portions 63 are located on the side in the second direction 7 of the outer circumference of the covering portion 9 on the side in the first direction 6. The reinforcing portions 63 are placed on the surface of the stretchable substrate 62 on the side in the −Z-direction. The reinforcing portions 63 have stretchability equal to the stretchable substrate 62 or are harder to expand than the stretchable substrate and easier to expand than the covering portion 9. Therefore, Young's modulus of the reinforcing portions 63 is equal to or larger than Young's modulus of the stretchable substrate 62 and smaller than Young's modulus of the covering portion 9.

When a tensile force acts on the stretchable substrate 62 in the first direction 6, the stretchable substrate 62 in the other parts than the part in the location in which the covering portion 9 is placed deform and expand. On the outer circumference of the covering portion 9 on the side in the first direction 6, the reinforcing portions 63 are placed on the sides in the second direction 7. The reinforcing portions 63 are elongated in the first direction 6 and extend to make the stretchable substrate 62 harder to expand in the first direction 6. Accordingly, deformation of the stretchable conducting films 52 is suppressed on the outer circumference of the covering portion 9 on the side in the first direction 6, and internal stress of the stretchable conducting films 52 is also suppressed. As a result, division of the stretchable conducting films 52 on the outer circumference of the covering portion 9 may be suppressed.

Figure 14:
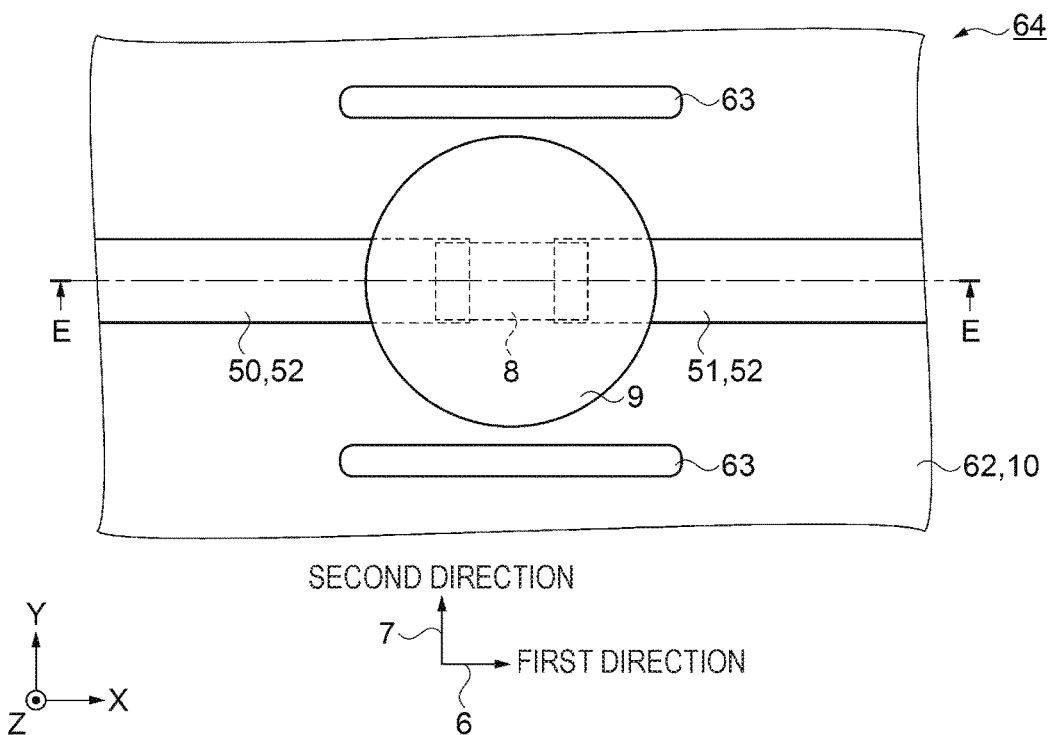
FIG. 14 is a schematic plan view showing the structure of the stretchable circuit board.
Figure 15:
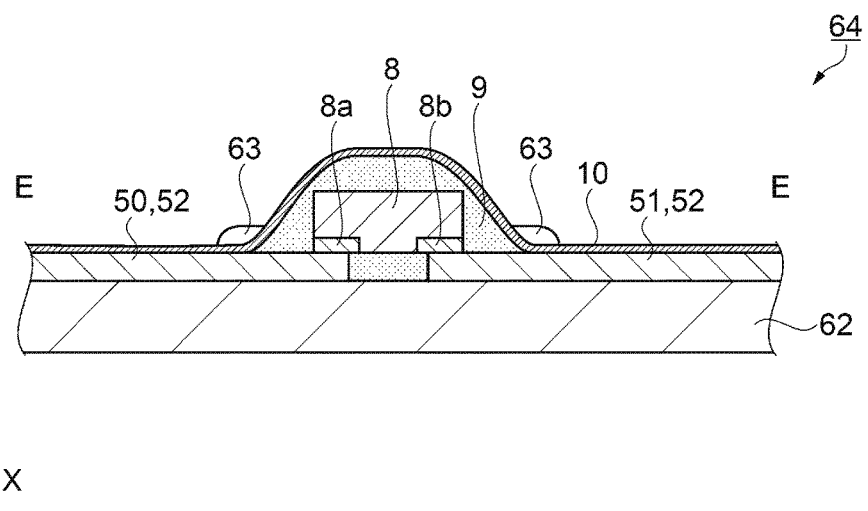
FIG. 15 is a schematic side sectional view showing the structure of the stretchable circuit board.

FIG. 14 is a schematic plan view showing the structure of the stretchable circuit board. FIG. 15 is a schematic side sectional view showing the structure of the stretchable circuit board. FIG. 15 shows the view as seen from the side of the section along the line EE in FIG. 14. That is, in the embodiment, in comparison with the stretchable circuit board 61, in a stretchable circuit board 64, the reinforcing portions 63 are not on the side in the −Z-direction of the stretchable substrate 62, but placed on the side in the +Z-direction as shown in FIGS. 14 and 15. In the reinforcing portions 63, reinforcing materials hard to deform are placed for the stretchable substrate 62.

Also, in this case, the reinforcing portions 63 are elongated in the first direction 6 to make the stretchable substrate 62 harder to expand in the first direction 6. The reinforcing portions 63 are located on the side in the second direction 7 of the outer circumference of the covering portion on the side in the first direction 6. Accordingly, deformation of the stretchable conducting films 52 is suppressed on the outer circumference of the covering portion 9 on the side in the first direction 6, and internal stress of the stretchable conducting films 52 is also suppressed. As a result, division of the stretchable conducting films 52 on the outer circumference of the covering portion 9 may be suppressed. Note that the reinforcing portions 63 may be placed on the side in the +Z-direction and the side in the −Z-direction of the stretchable substrate 62.

As described above, the embodiment has the following advantages.

(1) According to the embodiment, the stretchable conducting films 52 are placed on one surface of the stretchable substrate 62. The covering portion 9 is placed in parts on the stretchable conducting films 52 and the covering portion 9 covers the electric element 8. The reinforcing portions 63 are placed on the side in the second direction 7 of the outer circumference of the covering portion 9 on the side in the first direction 6. Further, the reinforcing portions 63 have shapes elongated in the first direction 6.

When a tensile force acts on the stretchable substrate 62 in the first direction 6, the stretchable substrate 62 in the other parts than the part in the location in which the covering portion 9 is placed deform and expand. On the outer circumference of the covering portion 9 on the side in the first direction 6, the reinforcing portions 63 are placed on the sides in the second direction 7. The reinforcing portions 63 are elongated in the first direction 6 to make the stretchable substrate 62 harder to expand in the first direction 6. Accordingly, deformation of the stretchable conducting films 52 is suppressed on the outer circumference of the covering portion 9 on the side in the first direction 6, and internal stress of the stretchable conducting films 52 is also suppressed. As a result, division of the stretchable conducting films 52 on the outer circumference of the covering portion 9 may be suppressed.

(2) According to the embodiment, in the reinforcing portions 63, the reinforcing materials are placed for the stretchable substrate 62. The reinforcing materials are harder to deform and may suppress deformation of the stretchable substrate 62. Therefore, the reinforcing portions 63 may make the stretchable substrate 62 harder to expand.

Fifth Embodiment

Next, one embodiment of the stretchable circuit board will be explained using FIGS. 16 and 17. The embodiment is different from the fourth embodiment in that the reinforcing portions 63 are formed using the same material as that of the stretchable substrate 62 and integrated with the substrate. The explanation of the same points as those of the fourth embodiment will be omitted.

Figure 16:
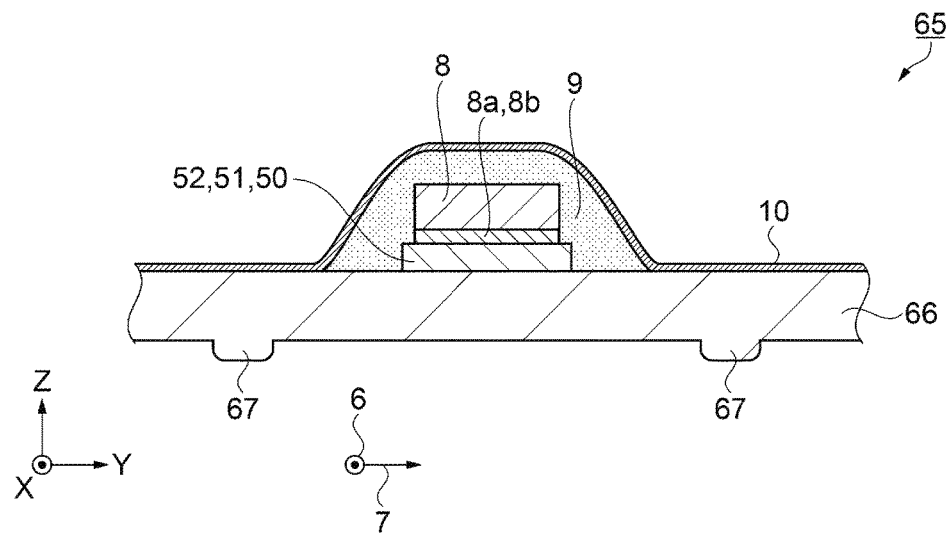
FIG. 16 is a schematic side sectional view showing a structure of a stretchable circuit board according to a fifth embodiment.

FIG. 16 is a schematic side sectional view showing a structure of the stretchable circuit board. That is, in the embodiment, a stretchable circuit board 65 includes a stretchable substrate 66 as shown in FIG. 16. On the side in the +Z-direction of the stretchable substrate 66, the stretchable conducting films 52 including the first wire 50 and the second wire 51, the electric element 8, the covering portion 9, and the wire protective portion 10 are placed. These have the same structures as those of the stretchable circuit board 61 in the fourth embodiment and their explanation will be omitted.

Reinforcing portions 67 are placed on the side in the −Z direction of the stretchable substrate 66 on the side in the +Y-direction and the side in the −Y-direction of the covering portion 9. The locations of the reinforcing portions 67 are the same as those of the reinforcing portions 63 of the stretchable circuit board 61 in the fourth embodiment. The material of the reinforcing portions 67 is the same as the material of the stretchable substrate 66, and the stretchable substrate 66 and the reinforcing portions 67 are integrated. Therefore, in the reinforcing portions 67, the thickness of the stretchable substrate 66 is thicker. Internal stress of the stretchable substrate 66 is smaller as the thickness of the stretchable substrate 66 is thicker, and thus, deformation of the stretchable substrate 66 may be suppressed. Therefore, the reinforcing portions 67 may make the stretchable substrate harder to expand. Accordingly, deformation of the stretchable conducting films 52 is suppressed on the outer circumference of the covering portion 9 on the side in the first direction 6, and internal stress of the stretchable conducting films 52 is also suppressed. As a result, division of the stretchable conducting films 52 on the outer circumference of the covering portion 9 may be suppressed.

Figure 17:
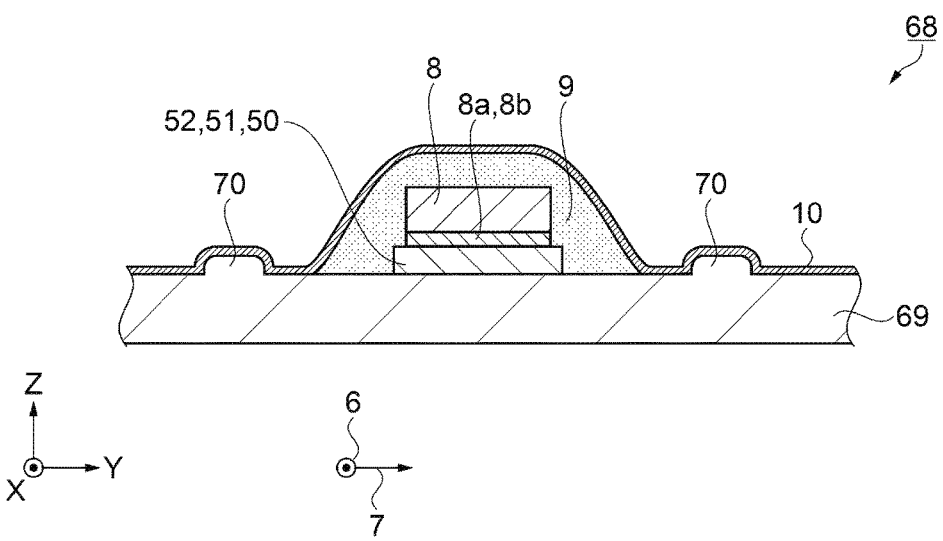
FIG. 17 is a schematic side sectional view showing the structure of the stretchable circuit board.

FIG. 17 is a schematic side sectional view showing the structure of the stretchable circuit board. That is, in the embodiment, a stretchable circuit board 68 includes a stretchable substrate 69 as shown in FIG. 17. On the side in the +Z-direction of the stretchable substrate 69, the stretchable conducting films 52 including the first wire 50 and the second wire 51, the electric element 8, the covering portion 9, and the wire protective portion 10 are placed. These have the same structures as those of the stretchable circuit board 64 in the fourth substrate, and their explanation will be omitted.

Reinforcing portions 70 are placed on the side in the +Z-direction of the stretchable substrate 69 on the side in the +Y-direction and the side in the −Y-direction of the covering portion 9. The locations of the reinforcing portions 70 are the same as those of the reinforcing portions 63 of the stretchable circuit board 64 in the fourth embodiment. The material of the reinforcing portions 70 is the same as the material of the stretchable substrate 69, and the stretchable substrate 69 and the reinforcing portions 70 are integrated. Therefore, in the reinforcing portions 70, the thickness of the stretchable substrate 69 is thicker. Internal stress of the stretchable substrate 69 is smaller as the thickness of the stretchable substrate 69 is thicker, and thus, deformation of the stretchable substrate 69 may be suppressed. Therefore, the reinforcing portions 70 may make the stretchable substrate harder to expand. Accordingly, deformation of the stretchable conducting films 52 is suppressed on the outer circumference of the covering portion 9 on the side in the first direction 6, and internal stress of the stretchable conducting films 52 is also suppressed. As a result, division of the stretchable conducting films 52 on the outer circumference of the covering portion 9 may be suppressed.

As described above, the embodiment has the following advantages.

(1) According to the embodiment, in the reinforcing portions 67 of the stretchable circuit board 65, the thickness of the stretchable substrate 66 is thicker. The internal stress of the stretchable substrate 66 is smaller as the thickness of the stretchable substrate 66 is thicker, and thus, the deformation of the stretchable substrate 66 may be suppressed. Therefore, the reinforcing portions 67 may make the stretchable substrate 66 harder to expand.

(2) According to the embodiment, in the reinforcing portions 70 of the stretchable circuit board 68, the thickness of the stretchable substrate 69 is thicker. The internal stress of the stretchable substrate 69 is smaller as the thickness of the stretchable substrate 69 is thicker, and thus, the deformation of the stretchable substrate 69 may be suppressed. Therefore, the reinforcing portions 70 may make the stretchable substrate 69 harder to expand.

Sixth Embodiment

Figure 18:
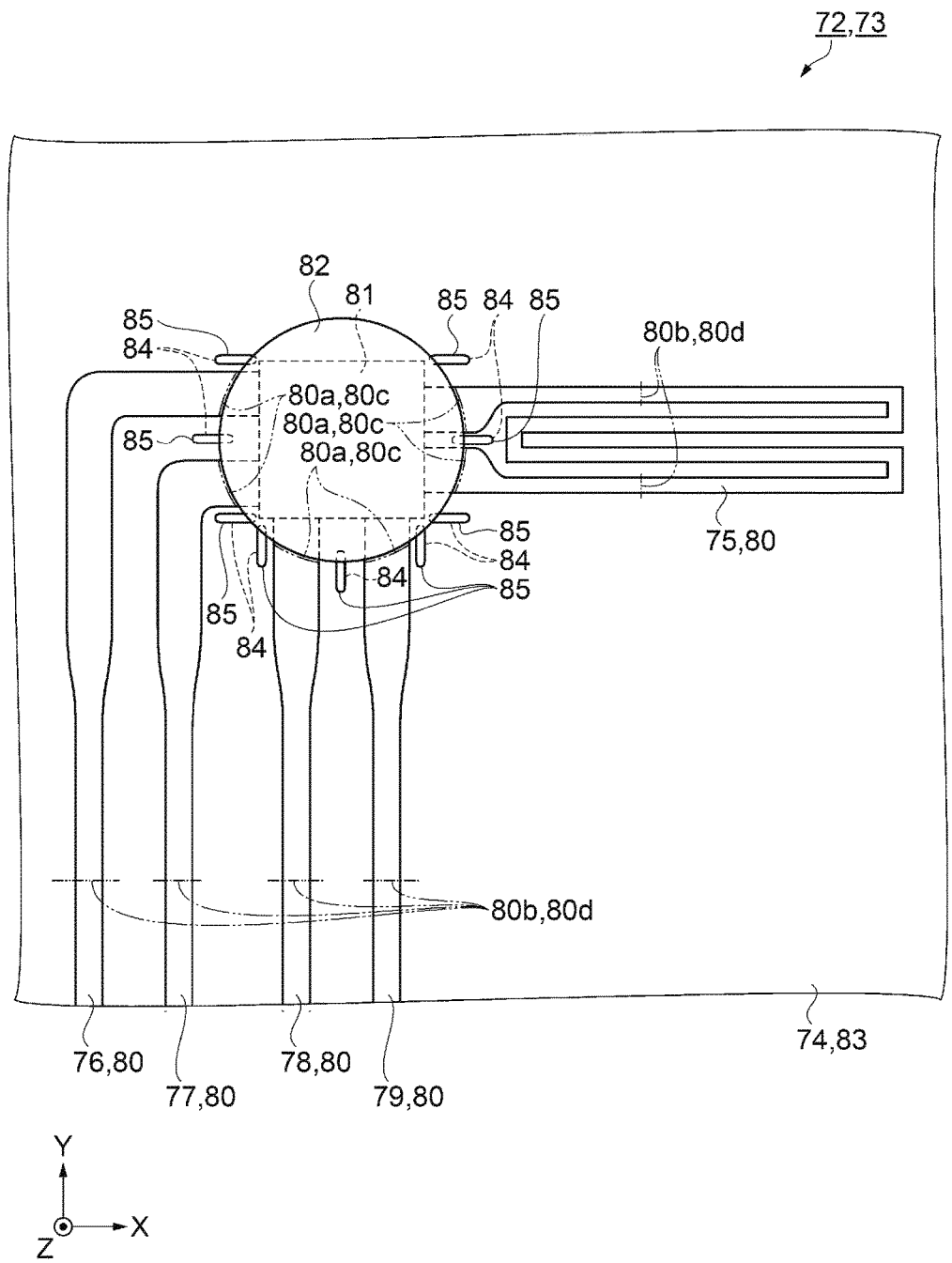
FIG. 18 is a schematic plan view showing a structure of a strain sensor according to a sixth embodiment.

Next, one embodiment of a strain sensor using the above described stretchable circuit board will be explained using FIG. 18. FIG. 18 is a schematic plan view showing a structure of the strain sensor. As shown in FIG. 18, a strain sensor 72 includes a stretchable circuit board 73, and the stretchable circuit board 73 includes a stretchable substrate 74. Further, on the stretchable substrate 74, stretchable conducting films 80 of a strain detection wire 75 as a detection part, a first power supply wire 76, a second power supply wire 77, a first signal line 78, and a second signal line 79 are placed. Furthermore, on the stretchable substrate 74, a circuit element 81 having a function of a driving driver that drives the strain detection wire 75 is placed. The circuit element 81 corresponds to the electric element 8 of the above described embodiments.

The strain detection wire 75, the first power supply wire 76, the second power supply wire 77, the first signal line 78, and the second signal line 79 are connected to the circuit element 81. On the circuit element 81, a covering portion 82 that covers at least apart of the circuit element 81 is placed. The covering portion 82 is placed to cover parts of the strain detection wire 75, the first power supply wire 76, the second power supply wire 77, the first signal line 78, and the second signal line 79. A wire protective portion 83 is placed to cover the stretchable substrate 74, the strain detection wire 75, the first power supply wire 76, the second power supply wire 77, the first signal line 78, the second signal line 79, and the covering portion 82. The wire protective portion 83 corresponds to the wire protective portion 10 of the above described embodiments, and the covering portion 82 corresponds to the covering portion 9.

Electric power is supplied from the first power supply wire 76 and the second power supply wire 77 to the circuit element 81. In the circuit element 81, a circuit that supplies a current to the strain detection wire 75 and an amplifier circuit are placed. The strain detection wire 75 is connected to the input terminal of the amplifier circuit. Further, the output terminal of the amplifier circuit is connected to the first signal line 78 and the second signal line 79.

When the stretchable substrate 74 is expanded in the X-direction, the strain detection wire 75 is expanded in the X-direction. In this regard, the length of the strain detection wire 75 becomes longer and the section of the strain detection wire 75 becomes smaller. Thereby, the resistance of the strain detection wire 75 becomes larger. When the resistance of the strain detection wire 75 becomes larger, the voltage drop by the strain detection wire 75 becomes larger. The amplifier circuit of the circuit element 81 amplifies and outputs the voltage drop by the strain detection wire 75 to the first signal line 78 and the second signal line 79. Therefore, a signal highly correlating with the strain of the strain detection wire 75 is output as a voltage signal between the first signal line 78 and the second signal line 79. As described above, the strain detection wire 75 is provided on the stretchable circuit board 73 and converts and output strain into an electric signal.

The stretchable circuit board 1 of the first embodiment may be applied to the strain sensor 72. In this case, the stretchable substrate 74 corresponds to the stretchable substrate 2. The strain detection wire 75, the first power supply wire 76, the second power supply wire 77, the first signal line 78, and the second signal line 79 correspond to the stretchable conducting films 5. Further, sections along the outer circumference of the covering portion 82 in the strain detection wire 75, the first power supply wire 76, the second power supply wire 77, the first signal line 78, and the second signal line 79 are referred to as first sections 80*a*, and sections in the locations apart from the outer circumference of the covering portion 82 toward outside are referred to as second sections 80*b*. In the respective lines, the lengths of the first sections 80*a* in the planar direction are made longer than widths of the second sections 80*b* in the planar direction. Thereby, division of the strain detection wire 75, the first power supply wire 76, the second power supply wire 77, the first signal line 78, and the second signal line 79 by the first sections 80*a* located on the outer circumference of the covering portion 82 may be suppressed.

The stretchable circuit board 20 of the second embodiment may be applied to the strain sensor 72. In this case, the stretchable substrate 74 corresponds to the stretchable substrate 2. The strain detection wire 75, the first power supply wire 76, the second power supply wire 77, the first signal line 78, and the second signal line 79 correspond to the stretchable conducting films 23. Further, sections along the outer circumference of the covering portion 82 in the strain detection wire 75, the first power supply wire 76, the second power supply wire 77, the first signal line 78, and the second signal line 79 are referred to as first sections 80*a*, and sections in the locations apart from the outer circumference of the covering portion 82 toward outside are referred to as second sections 80*b*. In the respective lines, the thicknesses of the first sections 80*a* are made thicker than thicknesses of the second sections 80*b*. Thereby, division of the strain detection wire 75, the first power supply wire 76, the second power supply wire 77, the first signal line 78, and the second signal line 79 by the first sections 80*a* located on the outer circumference of the covering portion 82 may be suppressed.

The stretchable circuit board 28 of the second embodiment may be applied to the strain sensor 72. In this case, the stretchable substrate 74 corresponds to the stretchable substrate 2. The strain detection wire 75, the first power supply wire 76, the second power supply wire 77, the first signal line 78, and the second signal line 79 correspond to the stretchable conducting films 29. Further, sections along the outer circumference of the covering portion 82 in the strain detection wire 75, the first power supply wire 76, the second power supply wire 77, the first signal line 78, and the second signal line 79 are referred to as first sections 80*a*, and sections in the locations apart from the outer circumference of the covering portion 82 toward outside are referred to as second sections 80*b*. In the respective lines, the thicknesses of the first sections 80*a* are made thicker than thicknesses of the second sections 80*b*. Thereby, division of the strain detection wire 75, the first power supply wire 76, the second power supply wire 77, the first signal line 78, and the second signal line 79 by the first sections 80*a* located on the outer circumference of the covering portion 82 may be suppressed.

The stretchable circuit board 32 of the second embodiment may be applied to the strain sensor 72. In this case, the stretchable substrate 74 corresponds to the stretchable substrate 33. The strain detection wire 75, the first power supply wire 76, the second power supply wire 77, the first signal line 78, and the second signal line 79 correspond to the stretchable conducting films 36. Further, sections along the outer circumference of the covering portion 82 in the strain detection wire 75, the first power supply wire 76, the second power supply wire 77, the first signal line 78, and the second signal line 79 are referred to as first sections 80*a*, and sections in the locations apart from the outer circumference of the covering portion 82 toward outside are referred to as second sections 80*b*. In the respective lines, the thicknesses of the first sections 80*a* are made thicker than thicknesses of the second sections 80*b*. Thereby, division of the strain detection wire 75, the first power supply wire 76, the second power supply wire 77, the first signal line 78, and the second signal line 79 by the first sections 80*a* located on the outer circumference of the covering portion 82 may be suppressed.

The stretchable circuit board 41 of the second embodiment may be applied to the strain sensor 72. In this case, the stretchable substrate 74 corresponds to the stretchable substrate 42. The strain detection wire 75, the first power supply wire 76, the second power supply wire 77, the first signal line 78, and the second signal line 79 correspond to the stretchable conducting films 45. Further, sections along the outer circumference of the covering portion 82 in the strain detection wire 75, the first power supply wire 76, the second power supply wire 77, the first signal line 78, and the second signal line 79 are referred to as first sections 80*a*, and sections in the locations apart from the outer circumference of the covering portion 82 toward outside are referred to as second sections 80*b*. In the respective lines, the thicknesses of the first sections 80*a* are made thicker than thicknesses of the second sections 80*b*. Thereby, division of the strain detection wire 75, the first power supply wire 76, the second power supply wire 77, the first signal line 78, and the second signal line 79 by the first sections 80*a* located on the outer circumference of the covering portion 82 may be suppressed.

The stretchable circuit board 48 of the third embodiment may be applied to the strain sensor 72. In this case, the stretchable substrate 74 corresponds to the stretchable substrate 49. The strain detection wire 75, the first power supply wire 76, the second power supply wire 77, the first signal line 78, and the second signal line 79 correspond to the stretchable conducting films 52. Further, sections along the outer circumference of the covering portion 82 in the stretchable substrate 74 are referred to as first sections 80*c*, and sections in the locations apart from the outer circumference of the covering portion 82 toward outside are referred to as second sections 80*d*. In the respective lines, the thicknesses of the first sections 80*c* are made thicker than thicknesses of the second sections 80*d*. Thereby, division of the strain detection wire 75, the first power supply wire 76, the second power supply wire 77, the first signal line 78, and the second signal line 79 by the first sections 80c located on the outer circumference of the covering portion 82 may be suppressed.

The stretchable circuit board 57 of the third embodiment may be applied to the strain sensor 72. In this case, the stretchable substrate 74 corresponds to the stretchable substrate 58. The strain detection wire 75, the first power supply wire 76, the second power supply wire 77, the first signal line 78, and the second signal line 79 correspond to the stretchable conducting films 52. Further, sections along the outer circumference of the covering portion 82 in the stretchable substrate 74 are referred to as first sections 80c, and sections in the locations apart from the outer circumference of the covering portion 82 toward outside are referred to as second sections 80d. In the respective lines, the thicknesses of the first sections 80c are made thicker than thicknesses of the second sections 80d. Thereby, division of the strain detection wire 75, the first power supply wire 76, the second power supply wire 77, the first signal line 78, and the second signal line 79 by the first sections 80c located on the outer circumference of the covering portion 82 may be suppressed.

The stretchable circuit board 61 of the fourth embodiment may be applied to the strain sensor 72. In this case, the stretchable substrate 74 corresponds to the stretchable substrate 62. The strain detection wire 75, the first power supply wire 76, the second power supply wire 77, the first signal line 78, and the second signal line 79 correspond to the stretchable conducting films 52. Further, reinforcing portions 84 are placed between the respective wires on the surface of the stretchable substrate 74 on the side in the −Z-direction. The reinforcing portions 84 are placed alongside with the respective wires and placed in the locations facing the outer circumference of the covering portion 82. The reinforcing portions 84 correspond to the reinforcing portions 63 of the stretchable circuit board 61. Thereby, division of the strain detection wire 75, the first power supply wire 76, the second power supply wire 77, the first signal line 78, and the second signal line 79 by the first sections 80a located on the outer circumference of the covering portion 82 may be suppressed.

The stretchable circuit board 64 of the fourth embodiment may be applied to the strain sensor 72. In this case, the stretchable substrate 74 corresponds to the stretchable substrate 62. The strain detection wire 75, the first power supply wire 76, the second power supply wire 77, the first signal line 78, and the second signal line 79 correspond to the stretchable conducting films 52. Further, reinforcing portions 85 are placed between the respective wires on the surface of the stretchable substrate 74 on the side in the +Z-direction. The reinforcing portions 85 are placed alongside with the respective wires and placed in the locations facing the outer circumference of the covering portion 82. The reinforcing portions 85 correspond to the reinforcing portions 63 of the stretchable circuit board 64. Thereby, division of the strain detection wire 75, the first power supply wire 76, the second power supply wire 77, the first signal line 78, and the second signal line 79 by the first sections 80a located on the outer circumference of the covering portion 82 may be suppressed.

The stretchable circuit board 65 of the fifth embodiment may be applied to the strain sensor 72. In this case, the stretchable substrate 74 corresponds to the stretchable substrate 66. The strain detection wire 75, the first power supply wire 76, the second power supply wire 77, the first signal line 78, and the second signal line 79 correspond to the stretchable conducting films 52. Further, the reinforcing portions 84 are placed between the respective wires on the surface of the stretchable substrate 74 on the side in the −Z-direction. The reinforcing portions 84 are placed alongside with the respective wires and placed in the locations facing the outer circumference of the covering portion 82. The reinforcing portions 84 are integrated with the stretchable substrate 74, and the reinforcing portions 84 correspond to the reinforcing portions 67 of the stretchable circuit board 65. Thereby, division of the strain detection wire 75, the first power supply wire 76, the second power supply wire 77, the first signal line 78, and the second signal line 79 by the first sections 80a located on the outer circumference of the covering portion 82 may be suppressed.

The stretchable circuit board 68 of the fifth embodiment may be applied to the strain sensor 72. In this case, the stretchable substrate 74 corresponds to the stretchable substrate 69. The strain detection wire 75, the first power supply wire 76, the second power supply wire 77, the first signal line 78, and the second signal line 79 correspond to the stretchable conducting films 52. Further, the reinforcing portions 85 are placed between the respective wires on the surface of the stretchable substrate 74 on the side in the +Z-direction. The reinforcing portions 85 are placed alongside with the respective wires and placed in the locations facing the outer circumference of the covering portion 82. The reinforcing portions 85 are integrated with the stretchable substrate 74, and the reinforcing portions 85 correspond to the reinforcing portions 70 of the stretchable circuit board 68. Thereby, division of the strain detection wire 75, the first power supply wire 76, the second power supply wire 77, the first signal line 78, and the second signal line 79 by the first sections 80a located on the outer circumference of the covering portion 82 may be suppressed.

As described above, one of the stretchable circuit board 1, the stretchable circuit board 20, the stretchable circuit board 28, the stretchable circuit board 32, the stretchable circuit board 41, the stretchable circuit board 48, the stretchable circuit board 57, the stretchable circuit board 61, the stretchable circuit board 64, the stretchable circuit board 65, and the stretchable circuit board 68 may be applied to the stretchable circuit board 73.

As described above, the embodiment has the following advantages.

(1) According to the embodiment, the strain sensor includes the stretchable circuit board 73, and the stretchable circuit board 73 converts and outputs strain into an electric signal. The strain detection wire 75 is placed on the stretchable circuit board 73 and, when the stretchable circuit board 73 expands and contracts, the strain detection wire 75 also expands and contracts. When the strain detection wire 75 expands, its resistance becomes higher and, when contracting, the resistance becomes lower. Therefore, a voltage is applied to the strain detection wire 75 and the current flowing in the strain detection wire 75 is detected, and thereby, the strain of the stretchable circuit board 73 may be converted into an electric signal. One of the stretchable circuit board 1, the stretchable circuit board 20, the stretchable circuit board 28, the stretchable circuit board 32, the stretchable circuit board 41, the stretchable circuit board 48, the stretchable circuit board 57, the stretchable circuit board 61, the stretchable circuit board 64, the stretchable circuit board 65, and the stretchable circuit board 68 is applied to the structure of the stretchable circuit board 73. Thereby, the stretchable circuit board 73 may suppress division of the stretchable conducting films 80 on the outer circumference of the covering portion 82. Therefore, the strain sensor 72 may be formed as a sensor including the stretchable circuit board 73 that may suppress division of the stretchable conducting films 80 on the outer circumference of the covering portion 82.

Note that the embodiments are not limited to the above described embodiments, but various changes and improvements can be made by a person having ordinary skill in the art within the technical idea of the invention. The modified examples are as follows.

MODIFIED EXAMPLE 1

In the above described first embodiment, the shapes of the stretchable conducting films 5 in the location in which the covering portion 9 is placed are shapes close to quadrangles. The shapes of the stretchable conducting films 5 in the locations are not limited to quadrangles, but may be polygons, circles, or ellipses. The electric element 8 may be formed in a shape to be easily mounted.

MODIFIED EXAMPLE 2

In the above described first embodiment, the shape of the covering portion 9 as seen from the Z-direction is a circular shape. The shape of the covering portion 9 is not limited to the circular shape, but may be a quadrangular shape, polygonal shape, or elliptical shape. The material of the covering portion 9 is printed, and thereby, various shapes may be formed. Or, the shape of the covering portion 9 may be formed in a shape similar to the shape of the electric element 8.

MODIFIED EXAMPLE 3

In the above described first embodiment, the thicknesses of the stretchable conducting films 5 in the first sections 11 and the thicknesses of the stretchable conducting films 5 in the second sections 12 are the same. Like the stretchable circuit board 20, the stretchable circuit board 28, the stretchable circuit board 32, and the stretchable circuit board 41 of the above described second embodiment, the thicknesses of the first sections 11 may be made thicker than the thicknesses of the second sections 12. Thereby, the areas of the first sections 11 may be made larger than the areas of the second sections 12. Further, like the stretchable circuit board 48 and the stretchable circuit board 57 of the above described third embodiment, the thicknesses of the stretchable substrate 2 in the first sections 11 may be made thicker than the thicknesses of the stretchable substrate 2 in the second sections 12.

Like the stretchable circuit board 61 and the stretchable circuit board 64 of the above described fourth embodiment, the reinforcing portions 63 may be placed. Or, like the stretchable circuit board 65 and the stretchable circuit board 68 of the above described fifth embodiment, the reinforcing portions 67 and the reinforcing portions 70 may be placed. Furthermore, division of the stretchable conducting films 5 on the outer circumference of the covering portion 9 may be suppressed.

MODIFIED EXAMPLE 4

In the stretchable circuit board 20, the stretchable circuit board 28, the stretchable circuit board 32, the stretchable circuit board 41 of the above described second embodiment, the thicknesses of the stretchable substrate 2 in the sections along the outer circumference of the covering portion 9 and the thicknesses of the stretchable substrate 2 in the sections in the locations apart from the outer circumference of the covering portion 9 toward outside are the same. Like the stretchable circuit board 48 and the stretchable circuit board 57 of the above described third embodiment, the thicknesses of the stretchable substrate 2 in the sections along the outer circumference of the covering portion 9 may be made thicker than the thicknesses of the stretchable substrate 2 in the sections in the locations apart from the outer circumference of the covering portion 9 toward outside.

Like the stretchable circuit board 61 and the stretchable circuit board 64 of the above described fourth embodiment, the reinforcing portions 63 may be placed. Or, like the stretchable circuit board 65 and the stretchable circuit board 68 of the above described fifth embodiment, the reinforcing portions 67 and the reinforcing portions 70 may be placed. Furthermore, division of the stretchable conducting films 5 on the outer circumference of the covering portion 9 may be suppressed.

MODIFIED EXAMPLE 5

In the stretchable circuit board 48 and the stretchable circuit board 57 of the above described third embodiment, like the stretchable circuit board 61 and the stretchable circuit board 64 of the above described fourth embodiment, the reinforcing portions 63 may be placed. Or, like the stretchable circuit board 65 and the stretchable circuit board 68 of the above described fifth embodiment, the reinforcing portions 67 and the reinforcing portions 70 may be placed. Furthermore, division of the stretchable conducting films 5 on the outer circumference of the covering portion 9 may be suppressed.

MODIFIED EXAMPLE 6

In the above described fourth embodiment, the reinforcing portions 63 have the linear shapes. The reinforcing portions 63 may have arc shapes or shapes along polygons. In the manufacturing process of the stretchable circuit board 64, the reinforcing portions 63 placed on the side in the +Z-direction of the stretchable substrate 62 may have a function of stopping the spread of the covering portion 9. Coupling of the covering portions 9 between the adjacent electric elements 8 may be suppressed. Further, the reinforcing portions 63 are placed on only one surface of the stretchable substrate 62. The reinforcing portions 63 may be placed on both surfaces of the stretchable substrate 62.

MODIFIED EXAMPLE 7

Also, in the above described fifth embodiment, the reinforcing portions 67 and the reinforcing portions 70 may have arc shapes or shapes along polygons. In the manufacturing process of the stretchable circuit board 68, the reinforcing portions 70 placed on the side in the +Z-direction of the stretchable substrate 69 may have a function of stopping the spread of the covering portion 9. Coupling of the covering portions 9 between the adjacent electric elements 8 may be suppressed. Further, the reinforcing portions 67 and the reinforcing portions 70 are placed on only one surface of the stretchable substrate 62. The reinforcing portions 67 and the reinforcing portions 70 may be placed on both surfaces of the stretchable substrate 62.

The entire disclosure of Japanese Patent Application No. 2017-087983 filed on Apr. 27, 2017 is expressly incorporated by reference herein.

What is claimed is:

1. A stretchable circuit board comprising:
   a stretchable substrate;
   a stretchable conducting film disposed on one surface of the stretchable substrate and elongated in a first direction;
   an electric element placed on the one surface of the stretchable substrate, the electric element being electrically connected to the stretchable conducting film; and
   a covering material disposed on the one surface of the stretchable substrate so as to cover a part of the stretchable conducting film and at least a part of the electric element,
   wherein a first cross-sectional area of a first cross section of the stretchable conducting film in a second direction orthogonal to the first direction along an outer circumference of the covering material in a plan view is larger than a second cross-sectional area of a second cross section of the stretchable conducting film in the second direction at a location outwardly spaced apart from the outer circumference of the covering material.

2. The stretchable circuit board according to claim 1,
   wherein a first length of the first cross section along the second direction is longer than a second length of the second cross section along the second direction.

3. The stretchable circuit board according to claim 2,
   wherein the first length is shorter than a third length of the covering material in the second direction in the plan view.

4. The stretchable circuit board according to claim 1,
   wherein a first thickness of the first cross section is larger than a second thickness of the second cross section.

5. A stretchable circuit board comprising:
   a stretchable conducting film disposed on one surface of a stretchable substrate; and
   a covering material disposed on the one surface of the stretchable substrate so as to cover a part of the stretchable conducting film and at least a part of an electric element,
   wherein a first thickness of a first cross section of the stretchable substrate along an outer circumference of the covering material in a plan view is larger than a second thickness of the stretchable substrate at a location spaced apart from the outer circumference of the covering material.

6. A stretchable circuit board comprising:
   a stretchable conducting film disposed on one surface of a stretchable substrate, the stretchable conducting film extending in a first direction;
   a covering material that covers a part of the stretchable conducting film and at least a part of an electric element; and
   a reinforcing member elongated in the first direction, the reinforcing member making the stretchable substrate harder to expand,
   wherein the reinforcing member is located at a location outwardly spaced apart from an outer circumference of the covering material in a second direction orthogonal to the first direction in a plan view.

7. The stretchable circuit board according to claim 6,
   wherein a thickness of the stretchable substrate overlapped with the reinforcing member in the plan view is larger than a thickness of the stretchable substrate without overlapping with the reinforcing member in the plan view.

8. The stretchable circuit board according to claim 6,
   wherein the reinforcing member includes a reinforcing material harder to deform the stretchable substrate.

9. A strain sensor comprising:
   the stretchable circuit board according to claim 1; and
   a detector provided on the stretchable circuit board, the detector converting strain into an electric signal and outputting the electric signal.

10. A strain sensor comprising:
    the stretchable circuit board according to claim 2; and
    a detector provided on the stretchable circuit board, the detector converting strain into an electric signal and outputting the electric signal.

11. A strain sensor comprising:
    the stretchable circuit board according to claim 3; and
    a detector provided on the stretchable circuit board, the detector converting strain into an electric signal and outputting the electric signal.

12. A strain sensor comprising:
    the stretchable circuit board according to claim 4; and
    a detector provided on the stretchable circuit board, the detector converting strain into an electric signal and outputting the electric signal.

13. A strain sensor comprising:
    the stretchable circuit board according to claim 5; and
    a detector provided on the stretchable circuit board, the detector converting strain into an electric signal and outputting the electric signal.

14. A strain sensor comprising:
    the stretchable circuit board according to claim 6; and
    a detector provided on the stretchable circuit board, the detector converting strain into an electric signal and outputting the electric signal.

15. A strain sensor comprising:
    the stretchable circuit board according to claim 7; and
    a detector provided on the stretchable circuit board, the detector converting strain into an electric signal and outputting the electric signal.

16. A strain sensor comprising:
    the stretchable circuit board according to claim 8; and
    a detector provided on the stretchable circuit board, the detector converting strain into an electric signal and outputting the electric signal.

* * * * *